United States Patent
Higashino et al.

(10) Patent No.: US 7,514,294 B2
(45) Date of Patent: Apr. 7, 2009

(54) SEMICONDUCTOR DEVICE AND A MANUFACTURING METHOD OF THE SAME

(75) Inventors: Tomoko Higashino, Tokyo (JP); Chuichi Miyazaki, Tokyo (JP); Yoshiyuki Abe, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 167 days.

(21) Appl. No.: 11/500,945

(22) Filed: Aug. 9, 2006

(65) Prior Publication Data
US 2007/0037321 A1 Feb. 15, 2007

(30) Foreign Application Priority Data
Aug. 10, 2005 (JP) .............................. 2005-231946

(51) Int. Cl.
*H01L 21/00* (2006.01)
(52) U.S. Cl. ................. 438/113; 438/118; 257/E21.596
(58) Field of Classification Search .................. 438/113, 438/68, 109, 110, 118; 257/686
See application file for complete search history.

(56) References Cited
U.S. PATENT DOCUMENTS
6,822,340 B2 * 11/2004 Lamson et al. .............. 257/790
7,239,021 B2 * 7/2007 Arai et al. .................... 257/777
2002/0094608 A1 * 7/2002 Brooks ........................ 438/118
2005/0224943 A1 * 10/2005 Sahaida et al. .............. 257/686
2006/0024924 A1 * 2/2006 Haji et al. .................... 438/464
2007/0134846 A1 * 6/2007 Takahashi et al. ........... 438/113

FOREIGN PATENT DOCUMENTS
JP 8-236554 9/1996

* cited by examiner

*Primary Examiner*—Phat X Cao
*Assistant Examiner*—Nga Doan
(74) *Attorney, Agent, or Firm*—Mattingly, Stanger, Malur & Brundidge, P.C.

(57) ABSTRACT

The semiconductor device having the structure which laminated the chip in many stages is made thin. A reforming area is formed by irradiating a laser beam, where a condensing point is put together with the inside of the semiconductor substrate of a semiconductor wafer. Then, after applying the binding material of liquid state to the back surface of a semiconductor wafer by a spin coating method, this is dried and a solid-like adhesive layer is formed. Then, a semiconductor wafer is divided into each semiconductor chip by making the above-mentioned reforming area into a division origin. By pasting up this semiconductor chip on the main surface of an other semiconductor chip by the adhesive layer of the back surface, the semiconductor device having the structure for which the semiconductor chip was laminated by many stages is manufactured.

6 Claims, 26 Drawing Sheets

SEMICONDUCTOR DEVICE AND A MANUFACTURING METHOD OF THE SAME

CROSS-REFERENCE TO RELATED APPLICATION

The present application claims priority from Japanese patent application No. 2005-231946 filed on Aug. 10, 2005, the content of which is hereby incorporated by reference into this application.

FIELD OF THE INVENTION

The present invention relates to the manufacturing method of a semiconductor device, and a semiconductor device technology, and particularly relates to the multi-stage layering technique of a chip.

DESCRIPTION OF THE BACKGROUND ART

In recent years, in connection with the size and weight reduction of the mobile computing devices represented by a cellular phone, the digital camera, etc. and the information storage medium represented by the memory card etc., densification of the semiconductor device built into these is advanced. The thickness reduction of the semiconductor chip which forms a semiconductor device is indispensable to the densification of a semiconductor device. The multi-stage laminated constitution which accumulates the semiconductor chips made thin to many stages, such as two stages, or three stages is also developed, and densification of the semiconductor device is advanced further.

The method which laminates the semiconductor chip of the second stage via a paste state binding material to the region inside a plurality of electrodes formed, for example on the main surface of the semiconductor chip of the first stage is one of the methods which paste up between the semiconductor chips accumulated to many stages. However, by this method, according to the press load at the time of mounting the semiconductor chip of the second stage, a paste state binding material may overflow between up and down semiconductor chips horizontally (to a plurality of electrodes of the semiconductor chip of the first stage), and may cover the electrode of the main surface of the lower semiconductor chip. Since the semiconductor chip is thin, the paste state binding material may crawl up to a main surface from the back surface through the side face of the upper semiconductor chip. Since the binding material is paste state, in addition to the accuracy of thickness being low, the semiconductor chip mounted on the binding material may incline.

As a method which solves such trouble, film-like adhesion members, such as a die attach film (Die Attach Film: henceforth DAF), are developed, for example, and it contributes to the miniaturization and thickness reduction of a semiconductor device, and multi-stage lamination of a semiconductor chip. There are Cut and Reel Method and Wafer Back Surface Sticking Method in the adhesion method of the semiconductor chip using DAF, for example. Cut and Reel Method is a method of transporting and sticking on the chip mounting surface of a lower semiconductor chip DAF cut to chip size, and sticking an other semiconductor chip on it. On the other hand, the above-mentioned Wafer Back Surface Sticking Method is a method of cutting the DAF simultaneously with a semiconductor chip at the time of dicing after sticking DAF so that the whole surface of the back surface of the semiconductor wafer may be covered, and sticking the semiconductor chip on the chip mounting surface of the lower semiconductor chip by DAF of the back surface.

About a die-bonding technology, Japanese Unexamined Patent Publication No. Hei 8-236554 (Patent Reference 1) has a description, for example. The technology of obtaining the semiconductor device which equipped the back surface with the thermoplastic electrically conductive polyimide layer, separating the wafer per chip after forming the thermoplastic electrically conductive polyimide layer on the back surface of the wafer with a spin coat method is disclosed.

[Patent Reference 1] Japanese Unexamined Patent Publication No. Hei 8-236554

SUMMARY OF THE INVENTION

However, the present inventor found out that the following problems occurred in the multi-stage laminated constitution of the semiconductor chip using the film adhesion member of the above.

The first is a problem regarding the thickness of a film-like adhesion member. That is, as for the thickness of a film-like adhesion member, being till about 10 □Dm is a limitation from the reason for transportation or manufacture of a film-like adhesion member. When explaining in detail, as for a film-like adhesion member, since adhesive layer is formed on a film substrate, thickness of the film substrate cannot be disregarded. Therefore, it is difficult to make it thin below 10 □m. For this reason, there is a problem of hampering the overall thickness reduction of the multi-stage laminated constitution of semiconductor chips.

The second is a problem by the change of a dicing method. Since a dicing method cuts making the high velocity revolution of the dicing blade so that the front surface of a wafer may be pressed, its stress applied to the wafer is very high. That is, although thickness reduction of the semiconductor wafer is advanced as mentioned above, there is a problem that a chipping will occur in a semiconductor wafer when a thin semiconductor wafer is cut by Blade Dicing Method, and the die strength of the thin semiconductor chip falls remarkably. Although there is a product which uses the low dielectric constant film (the so-called Low-k film) whose dielectric constant is lower than a silicon oxide as a wiring interlayer insulation film of a semiconductor chip from a viewpoint of improvement in the working speed of a semiconductor device, since there are cases of being easy to peel since a Low-k film is weak, and of having very small bubbles inside, it cannot be cut well by Blade Dicing Method. Then, Stealth Dicing Method attracts attention as a new dicing method which avoids those problems. This Stealth Dicing Method is a dicing method which irradiates laser beam to the inside of a semiconductor wafer, forms a reforming layer selectively, and cuts the semiconductor wafer by making the reforming layer into a division origin. Since even the very thin semiconductor wafer of thickness being about 30 □m is cut directly according to this method, without giving stress physically, a chipping can be reduced and die strength of the semiconductor chip is not reduced. Moreover, since high-speed dicing of more than or equal to 300 mm/s is possible irrelevant to the thickness of a semiconductor wafer, a throughput can also be improved. Therefore, Stealth Dicing Method is an indispensable technology to the thickness reduction of a semiconductor chip. However, when adopting Wafer Back Surface Sticking Method as mentioned above and Stealth Dicing Method is performed, since the resin layer does not pass laser beam, the resin layer itself cannot be cut, and DAF may be unable to be cut well. For this reason, although it is necessary to choose the resin material which adjusted hardness and brittleness excellent in cutting as a material of DAF, in addition to the increase of material cost in the case, the cutting surface of resin does not become uniform, and it is difficult to cut finely along a dicing line. For this reason, the yield and reliability of a semiconductor device fall. In order to make a cutting surface uniform, it is effective to make a resin layer thin to about 5 □m or less than it, but being till about 10 □m of the thickness of DAF is a limitation as mentioned above. Therefore, there is a problem that adoption of Stealth Dicing Method is hampered and the thickness reduction of a semiconductor chip is hampered.

Then, a purpose of the present invention is to offer a technology which can make thin the semiconductor device having the structure which laminated chips to many stages.

The above-described and the other purposes and novel features of the present invention will become apparent from the description herein and accompanying drawings.

Of the inventions disclosed in the present application, typical ones will next be summarized briefly.

That is, the present invention has a step which forms a solid-like adhesive layer applying a liquefied binding material to the back surface of a wafer by the spin coating method or the printing method, and a step which performs a laser dicing process to the wafer.

The present invention is provided with the structure which stacked a plurality of chips to many stages, and its thickness of the adhesive layer between the chips is thinner than the thickness of the adhesive layer between the chip of the undermost layer of the chips, and the wiring substrate which mounts this.

Advantages achieved by some of the most typical aspects of the invention disclosed in the present application will be briefly described below.

Namely, since thickness of the adhesive layer between the chips piled up to many stages can be made thin by having a step which applies a liquefied binding material to the back surface of a wafer by the spin coating method or the printing method, and forms a solid-like adhesive layer, and a step which performs a laser dicing process to the wafer, the semiconductor device having the structure which laminated the chip to many stages can be made thin.

DETAILED DESCRIPTION OF THE PREFERRED EMBODIMENTS

Figure 1:
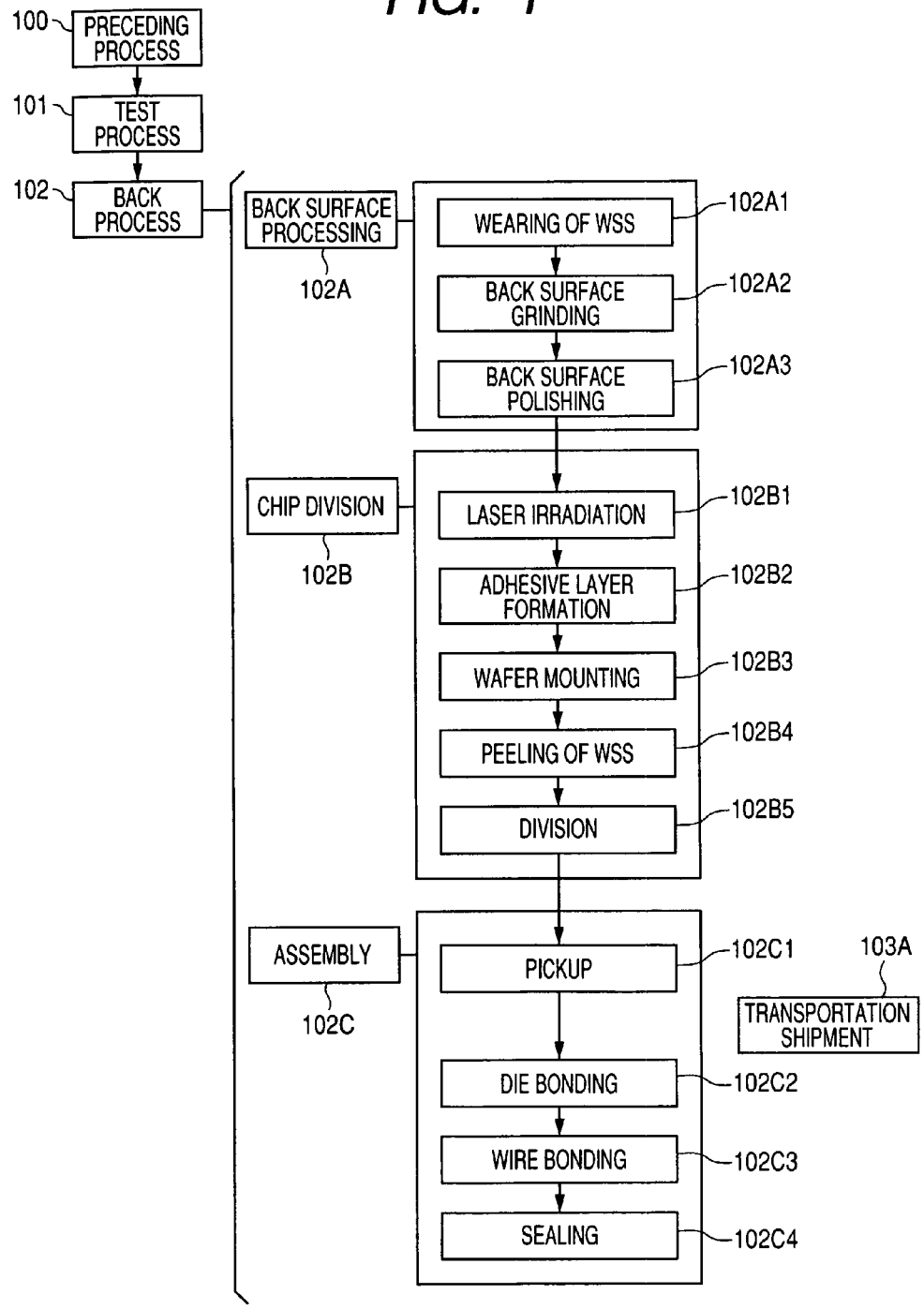
FIG. 1 is a flow diagram of the manufacturing process of a semiconductor device which is the one embodiment of the present invention.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated. And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number. Further, in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range. And, in all the drawings for describing the embodiments, members of a like function will be identified by like reference numerals and overlapping descriptions will be omitted as much as possible. Hereafter, embodiments of the invention are explained in detail based on drawings.

Embodiment 1

The manufacturing method of the semiconductor device of Embodiment 1 is explained along the flow diagram of FIG. 1.

First, in preceding process 100, the semiconductor wafer (henceforth a wafer) which has a main surface and a back surface which serve as the opposite side mutually along a thickness direction is prepared, and a plurality of semiconductor chips (henceforth a chip) are formed in the main surface (device formation surface) of the wafer. This preceding process 100 is also called a wafer process or a wafer fabrication, forms a chip (an element and a circuit) in the main surface of a wafer, and is a step until it changes into the state where an electrical test can be done with a probe etc. There are a film formation step, an impurity introduction (diffusion or ion implantation) step, photolithography step, an etching step, a metallizing step, a cleaning step, a test step between each step, etc. in a preceding process.

Figure 2:
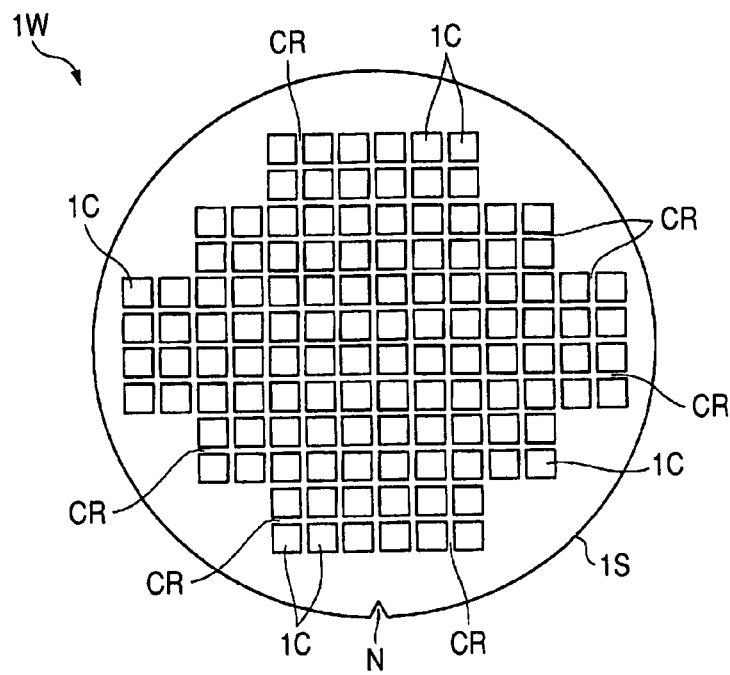
FIG. 2 is the whole main surface plan view of the semiconductor wafer after the preceding process of FIG. 1.
Figure 3:
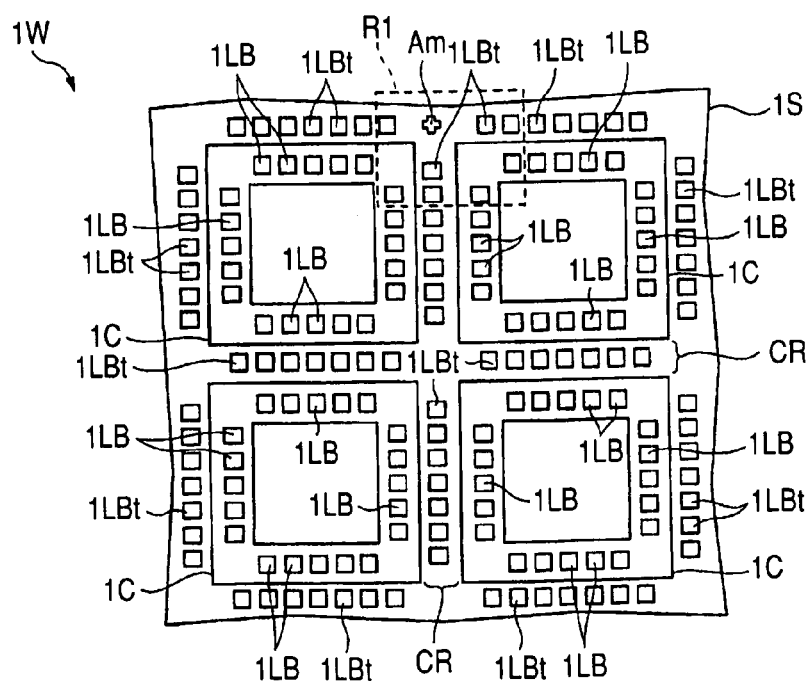
FIG. 3 is a principal part enlarged plan view of an example of the semiconductor wafer of FIG. 2.
Figure 4:
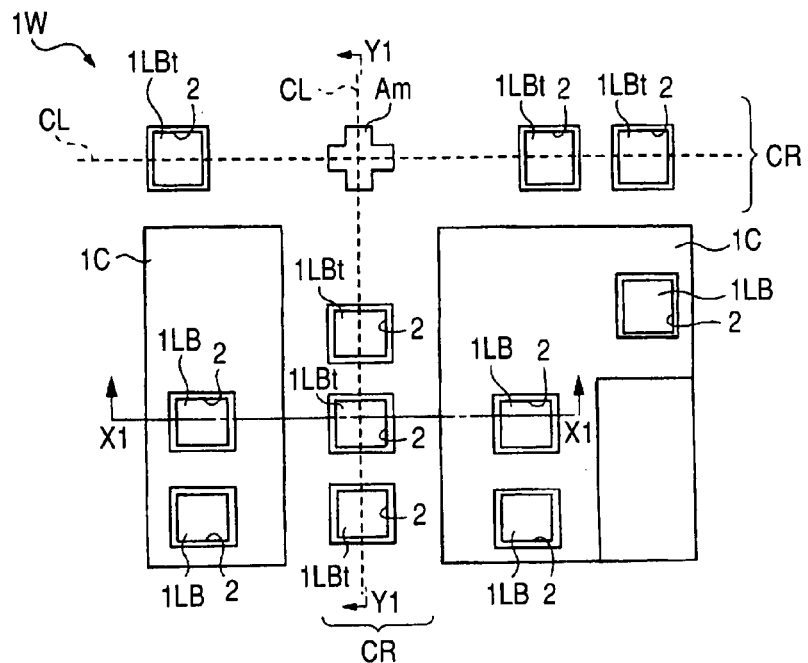
FIG. 4 is an enlarged plan view of region R1 of FIG. 3.
Figure 5:
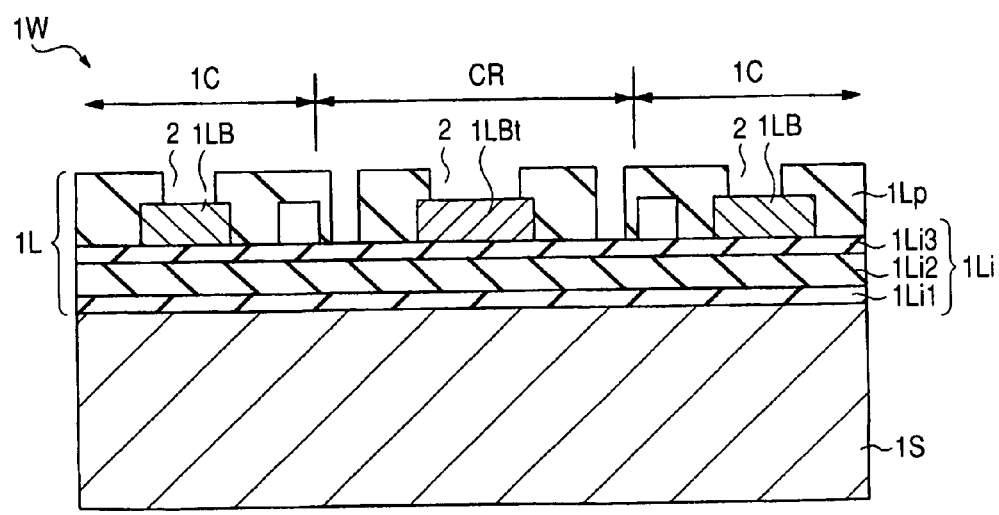
FIG. 5 is a cross-sectional view of X1-X1 line of FIG. 4.

FIG. 2 shows the whole main surface plan view of wafer 1W after this preceding process 100, FIG. 3 shows the principal part enlarged plan view of an example of wafer 1W of FIG. 2, FIG. 4 shows the enlarged plan view of region R1 of FIG. 3, and FIG. 5 shows the cross-sectional view of X1-X1 line of FIG. 4.

Wafer 1W is a semiconductor thin plate of about 300 mm in diameter of an almost circle shape in plan view, for example, and a plurality of chips 1C of plane quadrangular shape are arranged via cutting area (isolation region) CR in the main surface of the perimeter in each, for example. Semiconductor substrate (henceforth a substrate) 1S of wafer 1W includes a silicon (Si) single crystal, for example, and an element and wiring layer 1L are formed in the main surface. The thickness (total with the thickness of substrate 1S and the thickness of wiring layer 1L) of wafer 1W of this phase is about 775 □m, for example. Reference N of FIG. 2 shows a notch. Reference CL of FIG. 4 shows a cutting plane line. Cutting-plane-line CL is arranged so that it may pass along almost a center of the width direction (the short direction) of cutting area CR.

In the above-mentioned wiring layer 1L, interlayer insulation film 1Li, wirings, a bonding pad (external terminal; hereafter called a pad) 1LB, pad 1LBt for a test (TEG: Test Element Group), alignment target Am, and passivation film (henceforth protective film) 1Lp are formed. Interlayer insulation film 1Li has a plurality of interlayer insulation films 1Li1, 1Li2, and 1Li3. An insulating film of an inorganic system like a silicon oxide (SiO2 etc.) is used for interlayer insulation films 1Li1 and 1Li3, for example. A low dielectric constant film (Low-k film) like organic polymer or organic silica glass whose dielectric constant is lower than a silicon oxide is used for interlayer insulation film 1Li2 from a viewpoint of improvement in the working speed of a semiconductor device, for example.

As this organic polymer (perfect organic system low dielectric interlayer insulation film), there are SiLK (U.S. The Dow Chemical Co make, relative dielectric constant=2.7, heatproof temperature=490° C. or more, and dielectric breakdown voltage=4.0-5.0 MV/Vm), FLARE of the poly allyl ether (PAE) system material (U.S. Honeywell Electronic Materials make, relative dielectric constant=2.8, and heatproof temperature=400° C. or more), etc., for example. This PAE system material has the feature of basic performance being high and excelling in mechanical strength, thermal stability, and low cost characteristic.

As the above-mentioned organic silica glass (SiOC system material), there are HSG-R7 (Hitachi Chemical make, relative dielectric constant=2.8, and heatproof temperature=650° C.), Black Diamond (U.S. Applied Materials, Inc make, relative dielectric constant=3.0-2.4, and heatproof temperature=450° C.), p-MTES (Hitachi Development make, relative dielectric constant=3.2), etc., for example. As other SiOC system materials, there are CORAL (U.S. Novellus Systems, Inc make, relative dielectric constant=2.7-2.4, and heatproof temperature=500° C.), Aurora2.7 (ASM Japan K.K. make, relative dielectric constant=2.7, and heatproof temperature=450° C.), etc., for example.

For example, as other low dielectric constant film materials, the SiOF system material of perfect organic systems, such as FSG, HSQ (hydrogen silsesquioxane) system material, MSQ (methyl silsesquioxane) system material, a porous HSQ system material, a porous MSQ material, or a porous organic system material can also be used.

As the above-mentioned HSQ system material, there are OCD T-12 (TOKYO OHKA KOGYO make, relative dielectric constant=3.4-2.9, and heatproof temperature=450° C.), FOx (U.S. Dow Corning Corp. make, relative dielectric constant=2.9), OCL T-32 (TOKYO OHKA KOGYO make, relative dielectric constant=2.5, and heatproof temperature=450° C.) etc., for example.

As the above-mentioned MSQ system material, there are OCD T-9 (TOKYO OHKA KOGYO make, relative dielectric constant=2.7, and heatproof temperature=600° C.), LKD-T200 (JSR make, relative dielectric constant=2.7-2.5, and heatproof temperature=450° C.), HOSP (U.S. Honeywell Electronic Materials make, relative dielectric constant=2.5, and heatproof temperature=550° C.), HSG-RZ25 (Hitachi Chemical make, relative dielectric constant=2.5, and heatproof temperature=650° C.), OCL T-31 (TOKYO OHKA KOGYO make, relative dielectric constant=2.3, and heatproof temperature=500° C.), LKD-T400 (JSR make, relative dielectric constant=2.2-2, and heatproof temperature=450° C.), etc., for example.

As the above-mentioned porous HSQ system material, there are XLK (U.S. Dow Corning Corp. make, relative dielectric constant=2.5-2), OCL T-72 (TOKYO OHKA KOGYO make, relative dielectric constant=2.2-1.9, and heatproof temperature=450° C.), Nanoglass (U.S. Honeywell Electronic Materials make, relative dielectric constant=2.2-1.8, heatproof temperature=500° C. or more), or MesoELK (U.S. Air Productsand Chemicals, Inc, relative dielectric constant=2 or less).

As the above-mentioned porous MSQ system material, there are HSG-6211X (Hitachi Chemical make, relative dielectric constant=2.4, heatproof temperature=650° C.), ALCAP-S (Asahi Chemical Industry make, relative dielectric constant=2.3-1.8, heatproof temperature=450° C.), OCL T-77 (TOKYO OHKA KOGYO make, relative dielectric constant=2.2-1.9, heatproof temperature=600° C.), HSG-6210X (Hitachi Chemical make, relative dielectric constant=2.1, and heatproof temperature=650° C.) or silica aerogel (Kobe steel make, relative dielectric constants 1.4-1.1), for example.

As the above-mentioned porous organic system material, there is PolyELK (U.S. Air Productsand Chemicals, Inc, relative dielectric constant=2 or less, and heatproof temperature=490° C.) etc., for example.

The above-mentioned SiOC system material and SiOF system material are formed, for example by CVD method (Chemical Vapor Deposition). For example, above Black Diamond is formed by the CVD method which used the mixed gas of trimethylsilane and oxygen. Above-mentioned p-MTES is formed by the CVD method which used the mixed gas of methyltriethoxysilane and $N_2O$, for example. The other above-mentioned insulating material of the low dielectric constant is formed, for example by the applying method.

In FIG. 5, in order to simplify explanation, the monolayer shows interlayer insulation film 1Li2, but a plurality of low dielectric constant films are laminated in practice. Between these low dielectric constant films, insulating films, such as silicon carbide (SiC) and silicon carbonitride (SiCN), intervene, for example. Between insulating films, such as the silicon carbide, silicon carbonitride, etc., and a low dielectric constant film, the cap insulating film which includes for example, silicon oxide (SiOx) represented by silicon dioxide ($SiO_2$) may intervene. This cap insulating film has functions at the time of the Chemical Mechanical Polishing process (CMP; Chemical Mechanical Polishing), such as reservation of mechanical strength, a surface protection, moisture resistance reservation, etc. of a low dielectric constant film, for example. The thickness of this cap insulating film is formed relatively thinly rather than the low dielectric constant film. However, a cap insulating film is not limited to a silicon oxide film, and can be changed variously, for example, a silicon nitride ($Si_xN_y$) film, a silicon carbide film, or a silicon carbonitride film may be used for it. These silicon nitride films, a silicon carbide film, or a silicon carbonitride film can be formed, for example by plasma CVD method. As a silicon carbide film formed by plasma CVD method, there is BLOk (AMAT make, relative dielectric constant=4.3), for example. On the occasion of the formation, the mixed gas of trimethylsilane and helium (or $N_2$, $NH_3$) is used, for example.

By FIG. 5, in order to simplify explanation, the wiring is not shown in interlayer insulation film 1Li2, but actually, the above-mentioned wiring becomes a multilayer and is formed in interlayer insulation film 1Li2. Let this wiring be an embedded wiring, for example. That is, this wiring is formed by a conductor film being embedded in the wiring gutter formed in each layer of interlayer insulation film 1Li2. The conductor film which forms a wiring has a main conductor film, and the barrier metal film formed so that it covers the peripheral surface (a bottom face and a side face). The main conductor film includes, for example copper (Cu). The barrier metal film includes, for example titanium nitride (TiN), tungsten nitride (WN), tantalum nitride (TaN), tantalum (Ta), titanium (Ti), tungsten (W), titanium tungsten (TiW), or those laminated films.

The wiring, pad 1LB, 1LBt, and alignment target Am on interlayer insulation film 1Li3 includes, for example metallic films, such as aluminium. Such a wiring and pad 1LB, LBt, etc. of the uppermost are covered by protective film 1Lp formed in the top layer of wiring layer 1L. Protective film 1Lp includes for example, the laminated film of the insulating film of an inorganic system like silicon oxide, the insulating film of an inorganic system like a silicon nitride deposited on it, and the insulating film of an organic system like polyimide resin further deposited on it. Opening 2 is formed in a part of this protective film 1Lp, and a part of pad 1LB and 1LBt are exposed from there. Along the periphery of chip 1C, pad 1LB is arranged and located in a line, and is electrically connected with the integrated circuit device of chip 1C through the wiring in the above-mentioned interlayer insulation film 1Li.

Pad 1LBt for a test and alignment target Am are arranged at cutting area CR of chip 1C. Pad 1LBt for a test is formed in plane rectangular shape, for example, and is electrically connected with the element for TEG through the above-mentioned wiring. Alignment target Am is a pattern used in the case of for example, the alignment of manufacturing apparatuses, such as an aligner, and chip 1C of wafer 1W, and is formed in plane cross shape, for example. Alignment target Am may be formed in the shape of an L character and dot form other than cross shape.

In test process 101 of the continuing FIG. 1, a probe is put to pad 1LB of respective chips 1C and pad 1LBt for a test of cutting area CR of wafer 1W, and various kinds of electrical property tests are conducted by it. This test process is also called a G/W (Good chip/Wafer) check step, and is an examination process which mainly judges the quality of respective chips 1C formed in wafer 1W electrically.

Back process 102 of the continuing FIG. 1 is a step of until it stores the above-mentioned chip 1C to a sealing body (package) and completes, and has back surface processing step 102A, chip division step 102B, and assembly process 102C. Hereafter, back surface processing step 102A, chip division step 102B, and assembly process 102C are explained in order.

Figure 6:
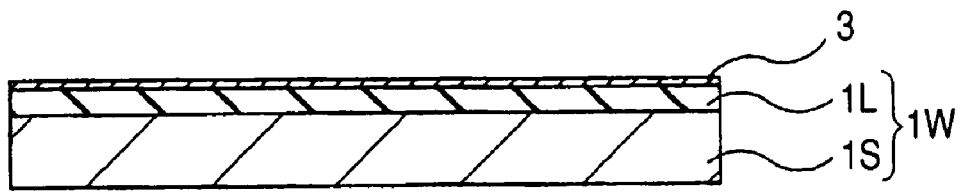
FIG. 6 is a cross-sectional view of the semiconductor wafer in the back surface processing step of FIG. 1.
Figure 7:
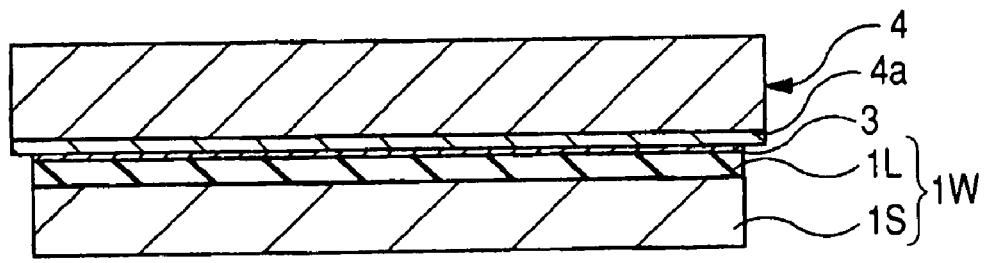
FIG. 7 is a cross-sectional view of the semiconductor wafer in the back surface processing step following FIG. 6.
Figure 8:
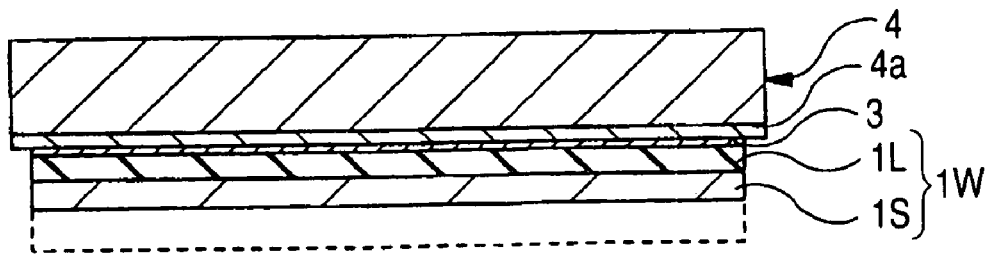
FIG. 8 is a cross-sectional view of the semiconductor wafer in the back surface processing step following FIG. 7.

FIG. 6-FIG. 8 show the cross-sectional view of wafer 1W in the above-mentioned back surface processing step 102A.

First, as shown in FIG. 6, adhesive layer 3 is uniformly applied by a spin coating (spin coat) method etc. all over the main surface of wafer 1W. Then, as shown in FIG. 7, supporting substrate 4 is stuck via adhesive layer 3 on the main surface of wafer 1W (step 102A1 of FIG. 1). This supporting substrate 4 is a wafer support system (Wafer Support System: WSS) which functions as a reinforcing member of wafer 1W in a next step. Hereby, at the time of transportation of wafer 1W, wafer 1W of ultra thin and a major diameter can be handled in the state where it was stabilized. Since wafer 1W can also be protected from an external impact, a crack, a chip, etc. of wafer 1W can be suppressed or prevented. Since a warp and bending of wafer 1W can be suppressed or prevented, and the flatness of wafer 1W of ultra thin and a major diameter can be improved at the time of each next step, the stability and controllability of a process of each step can be improved. As a material of supporting substrate 4, a hard supporting substrate (Hard-WSS or Glass-WSS) like transparent glass is used, for example. However, other hard supporting substrates (Hard-WSS) like stainless steel may be used as other materials of supporting substrate 4, for example. As a material of further others of supporting substrate 4, for example, tape WSS which stuck insulated supporting substrates, such as PET (Polyethylene Terephthalate) and PEN (Polyethylene Naphthalate), on the tape base may be used. When sticking supporting substrate 4 on the main surface of wafer 1W, supporting substrate 4 is fixed to the main surface of wafer 1W by pushing and attaching the formation surface of peeling layer 4a of supporting substrate 4 on adhesive layer 3. This peeling layer 4a is a functional layer for making peeling easy, when peeling supporting substrate 4 from wafer 1W.

Then, as shown in FIG. 8, after measuring the thickness of wafer 1W, based on the result of the measurement, a thickness reduction process is performed to wafer 1W. Here, grinding processing and polishing processing (flat processing) are performed to the back surface of wafer 1W (steps 102A2, 102A3 of FIG. 1). The thickness (total with the thickness of substrate 1S and the thickness of wiring layer 1L) of wafer 1W after such a thickness reduction process is made 100 □m or less (for example, about 90 □m, about 70 □m, or about 50 □m), for example. When the thickness of wafer 1W becomes thin and becomes less than or equal to 100 □m, the die strength of a chip will fall owing to the damage and stress which were generated at the back surface of wafer 1W by the above-mentioned back surface grinding processing, and it will become easy to generate the trouble that a chip will break by the pressure when mounting the chip here. For this reason, the back surface polishing process after back surface grinding processing is an important process when losing damage and stress of the back surface of wafer 1W, so that such trouble may not happen. As a back surface polishing process, besides the method of polishing using a polishing pad and silica and Chemical Mechanical Polishing (CMP) method, for example, the etching method using nitric acid and fluoric acid, may be used. However, when flattening of the back surface of wafer 1W is made by the polishing process, impurities may be easily diffused toward wafer 1W inside (device formation surface) from the back surface of wafer 1W. Therefore, in the case of the product which needs to operate irregularity (damage, stress, etc.) of the back surface of wafer 1W as a gettering layer for impurity capture, a back surface polishing process is not performed, but it may leave irregularity (damage, stress, etc.) intentionally to the back surface of wafer 1W. The broken line of FIG. 8 shows substrate 1S before the thickness reduction process.

Figure 9:
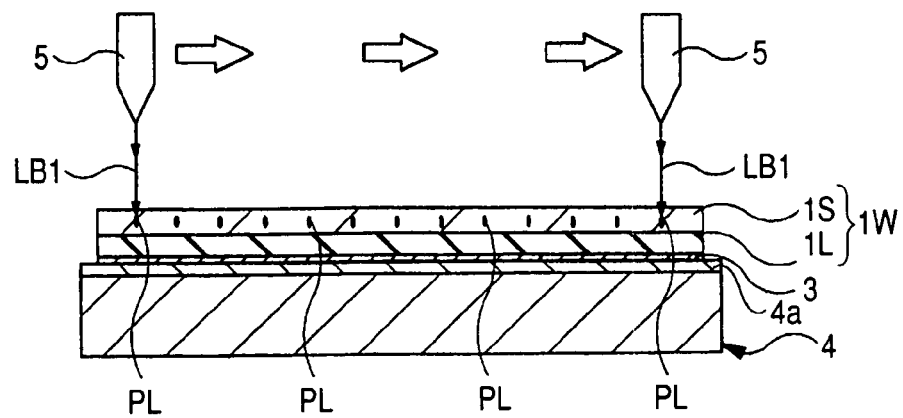
FIG. 9 is a cross-sectional view of the semiconductor wafer at the time of the laser-irradiation step of the chip division step of FIG. 1.
Figure 10:
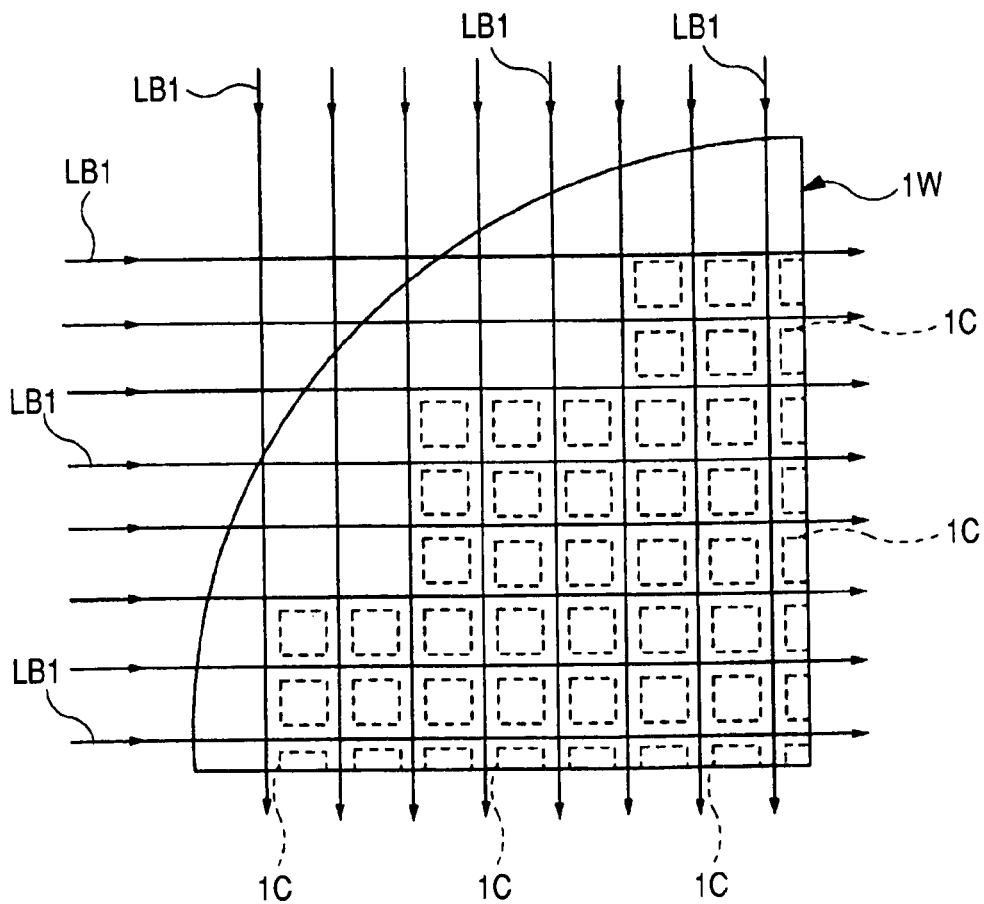
FIG. 10 is a principal part enlarged plan view of the semiconductor wafer at the time of the laser irradiation step of the chip division step of FIG. 1.

Next, FIG. 9 shows the cross-sectional view of wafer 1W at the time of laser irradiation step 102B1 of chip division step 102B, and FIG. 10 shows the principal part enlarged plan view of wafer 1W of FIG. 9.

First, ultra thin wafer 1W is transported while sticking supporting substrate 4 on the main surface to a laser dicing apparatus, and where the back surface of the wafer 1W is turned upwards, it is laid on a chuck. Then, the patterns (pad 1LBt and alignment target Am arranged at cutting area CR, pad 1LB arranged in chip 1C, etc. besides the pattern of chip 1C or cutting area CR) of the main surface of wafer 1W are recognized from the back surface of wafer 1W using an infrared camera (henceforth, IR camera). Then, after carrying out alignment (location amendment) of cutting-plane-line CL based on the pattern information acquired with IR camera, while irradiating laser beam (energy beam) LB1 emitted from laser generating part 5 from the back surface side of wafer 1W where a condensing point is put together with the inside of substrate 1S of wafer 1W, it is made to move along cuttingplane-line CL by which alignment was made based on the above-mentioned pattern information. This forms reforming area (optical damaged part or crushing layer) PL by multiple photon absorption in the inside of substrate 1S in cutting area CR of wafer 1W. This reforming area PL is formed by the inside of wafer 1W having been heated and melted by multiple photon absorption, and serves as a cutting origin region of wafer 1W at the time of a later chip division step. This melting treatment region is the region re-solidified after once melting, a region of a just molten state, and a region in the state of re-solidifying from a molten state, and can also be called the region which made the change of phase, and region where the crystal structure changed. As for a melting treatment region, it can also be called the region where a certain structure changed to another structure in single-crystal structure, amorphous structure, and polycrystalline structure. For example, substrate 1S portion means the region which changed from single-crystal structure to amorphous structure, the region which changed from single-crystal structure to polycrystalline structure, and the region which changed from single-crystal structure to the structure comprising amorphous structure and polycrystalline structure.

Along cutting area CR, laser beam LB1 may be irradiated continuously and may be irradiated intermittently. When laser beam LB1 is irradiated continuously, reforming area PL is formed in the shape of a straight line along cutting-plane-line CL. When laser beam LB1 is irradiated intermittently, reforming area PL is formed in the shape of a broken line (dot form). Although the above-mentioned low dielectric constant film may discolor with the heat at the time of irradiation of laser beam LB1 since the heat conductivity is low and it is easily filled with heat, since an irradiation area of laser beam LB1 can be made small and the generation of the heat by irradiation of laser beam LB1 can be suppressed as much as possible when laser beam LB1 is irradiated intermittently, discoloration of the low dielectric constant film by heat can be suppressed or prevented.

Since the back surface of wafer 1W is a plane of incidence of laser beam LB1, in order to reduce or prevent diffusion of laser beam LB1, it is preferred that it is flat and a glide plane. In formation of reforming area PL, since laser beam LB1 is hardly absorbed with the back surface of wafer 1W, the back surface of wafer 1W does not melt. Although not limited in particular, the irradiation conditions of laser beam LB1 are as follows, for example. Namely, the kind of laser beam LB1 is LD excitation solid pulsed laser, for example. an illuminant is a YAG laser whose wave length is 1064 nm, for example, a frequency is 400 kHz, for example, laser power is less than or equal to 1 W, for example, the diameter of laser spot is 1-2 □m, for example, and the traveling speed of laser beam LB1 is about 300 mm/s, for example.

Figure 11:
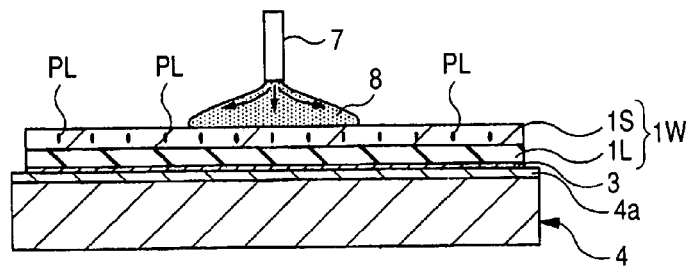
FIG. 11 is a cross-sectional view of the semiconductor wafer at the time of the adhesive layer forming step of the chip division step of FIG. 1.
Figure 12:
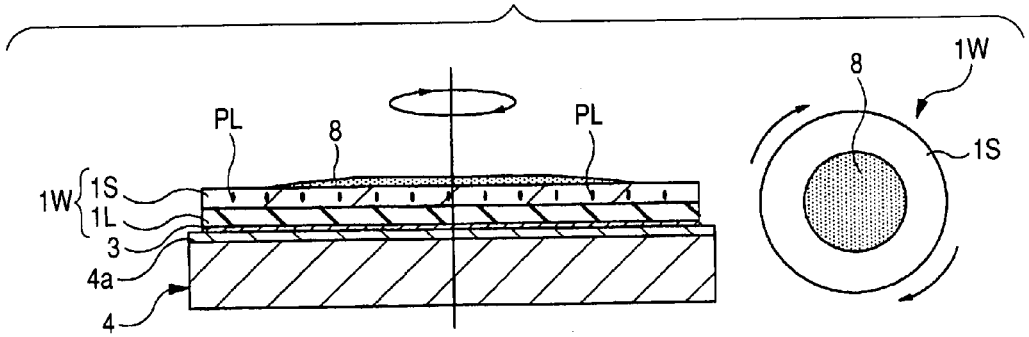
In FIG. 12, left-hand side is a cross-sectional view of the semiconductor wafer at the time of the adhesive layer forming step following FIG. 11, and right-hand side is the whole back surface plan view of the semiconductor wafer at the time of the adhesive layer forming step following FIG. 11.
Figure 13:
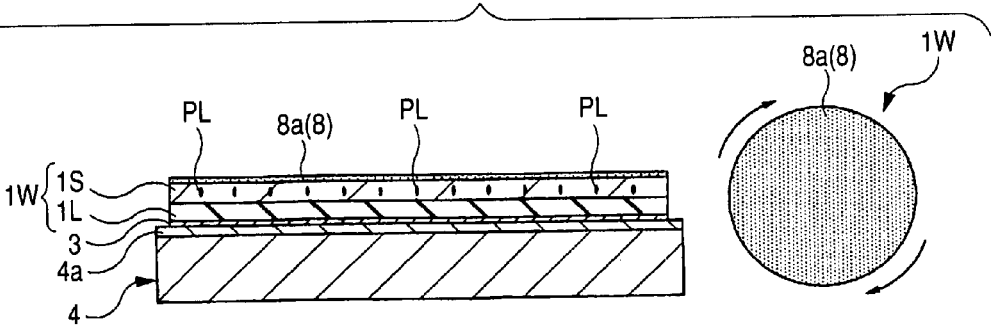
In FIG. 13, left-hand side is a cross-sectional view of the semiconductor wafer at the time of the adhesive layer forming step following FIG. 12, and right-hand side is the whole back surface plan view of the semiconductor wafer at the time of the adhesive layer forming step following FIG. 12.

Next, FIG. 11-FIG. 13 show the appearance of wafer 1W at the time of adhesive layer forming step 102B2 of chip division step 102B. FIG. 11 shows the cross-sectional view of wafer 1W, the left-hand side of FIG. 12 and FIG. 13 shows the cross-sectional view of wafer 1W, and right-hand side shows the whole back surface plan view of wafer 1W, respectively.

First, wafer 1W picked out from the above-mentioned laser dicing apparatus is transported while sticking supporting substrate 4 on the main surface to a spin coating apparatus (spin coater), where the back surface of the wafer 1W is turned upwards, it is laid on a rotation support base, and it is fixed by making vacuum adsorption. Then, as shown in FIG. 11, binding material 8 of liquid state (paste state) is dropped in the center on the back surface of wafer 1W from nozzle 7 of a spin coating apparatus. The base material of this binding material 8 includes, for example thermoplastic resin. As an example of thermoplastic resin, there is polyimide resin, for example. Thermosetting resin may be used as base material of binding material 8, for example. As an example of thermosetting resin, there is an epoxy resin, polyimide resin, or silicone resin, for example. Then, as shown in FIG. 12, the coat of thin binding material 8 is formed all over the back surface of wafer 1W by making the high velocity revolution of the wafer 1W (spin coating method). Then, wafer 1W is transported while sticking supporting substrate 4 on the main surface on a heat stage, a drying process is performed on the conditions for 100-200° C. and about 30 minutes, for example and binding material 8 is solidified. When the base material of binding material 8 is thermosetting resin, thermosetting resin is cured to some extent by a heat treatment, but it is not made to harden thoroughly but limits to the state of having adhesive property. Thus, as shown in FIG. 13, thin solid-like adhesive layer 8a is formed all over the back surface of wafer 1W. Adhesive layer 8a obtained by solidifying this binding material 8 is because chip 1C obtained from wafer 1W is fixed on an other chip at the next step, and it is formed all over the back surface of wafer 1W so that the thickness may become uniform. The thickness of adhesive layer 8a is thinner than 10 □m, for example, is about 5 □m or less than it, for example. Since adhesive layer 8a is formed by solidifying after making spin coating of the binding material 8 only as mentioned above, by the part which does not need a film substrate like DAF, it is possible to form the thickness of adhesive layer 8a more thinly than DAF.

Embodiment 1 explained how to form the coat of thin binding material 8 all over the back surface of wafer 1W by making the high velocity revolution of the wafer 1W, after binding material 8 of liquid state (paste state) is dropped in the center on the back surface of wafer 1W from nozzle 7 of a spin coating apparatus. However, in using what has the high viscosity of adhesives 8, it is preferred for binding material 8 of liquid state (paste state) to be dropped in the center on the back surface of wafer 1W, where the high velocity revolution of the wafer 1W is made beforehand, and to change an engine speed after that, and to form the coat of thin binding material 8 all over the back surface of wafer 1W.

In Embodiment 1, thickness of adhesive layer 8a can be made thin as mentioned above by forming adhesive layer 8a using a spin coating method as mentioned above. Since adhesive layer 8a is formed with a resin coating method, the homogeneity of the thickness of adhesive layer 8a in the back surface of wafer 1W can be improved. Since the spin coating of the adhesives 8 can be carried out in the state where the flatness of wafer 1W is high, by sticking supporting substrate 4 on the main surface of wafer 1W, the homogeneity of the thickness of adhesive layer 8a in the back surface of wafer 1W can be improved. When not using above WSS, when sticking only a tape material on the main surface of wafer 1W, or when using the above-mentioned tape WSS, it is preferred to make spin coating of the binding material 8, where vacuum suction of the whole surface of the main surface of wafer 1W is made to the above-mentioned rotation support base side. Thus, since reduction or prevention of warp and bending of wafer 1W which is ultra thin and a major diameter can be done, and the flatness of wafer 1W can be improved by making vacuum suction of the whole surface of the main surface of wafer 1W, the homogeneity of the thickness of adhesive layer 8a in the back surface of wafer 1W can be improved.

When DAF is used, a specification changes with sizes, thickness, etc. of wafer 1W, but in the case of a resin coating method like Embodiment 1, a resin material is good at one kind, and does not depend in particular on the size or thickness of wafer 1W. Since molding technology and processing technology for which DAF is asked are unnecessary, cost can be reduced. When adhering DAF on wafer 1W, in order to lose the wrinkle and void between wafer 1W and DAF and to raise adhesion, the application of pressure to wafer 1W is required, but with thin wafer 1W less than or equal to 50 □m, we are anxious about the damage to wafer 1W by application of pressure increasingly. On the other hand, in Embodiment 1, in formation of adhesive layer 8a, the application of pressure to wafer 1W is unnecessary, and damage degradation of wafer 1W can be reduced or prevented. Therefore, the yield and reliability of a semiconductor device can be improved.

Figure 14:
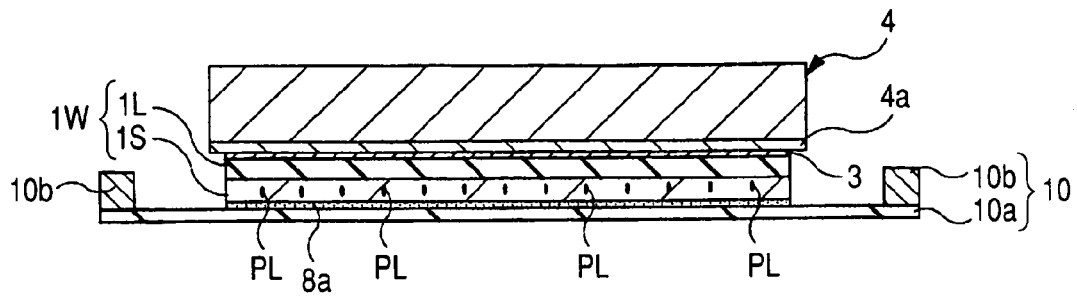
FIG. 14 is a cross-sectional view of the semiconductor wafer at the time of the wafer mounting step of the chip division step of FIG. 1.

Next, FIG. 14 shows the cross-sectional view of wafer 1W after wafer mounting step 102B3 of chip division step 102B.

At this step, as shown in FIG. 14, where supporting substrate 4 is stuck on the main surface of wafer 1W, the back surface (formation surface of adhesive layer 8a) of wafer 1W is stuck on tape 10a of jig 10. The tape base of tape 10a of jig 10 includes a plastic material which has flexibility, for example, and the adhesive layer is formed in the main surface. Wafer 1W is being firmly fixed by the adhesive layer of tape 10a. As this tape 10a, it is also preferred to use a UV tape, for example. A UV tape is an adhesive tape with which ultraviolet-rays (UV) hardening resin was used as a material of an adhesive layer, and has a characteristic in which the adhesion of an adhesive layer will become weak when ultraviolet rays are irradiated rapidly, having powerful adhesion. Ring 10b is stuck on the main surface periphery of tape 10a by the adhesive layer of tape 10a. This ring 10b is a reinforcing member of tape 10a. Although forming with metal, such as stainless steel, is preferred as for the viewpoint of this reinforcement to ring 10b, it may be formed with the plastic material which set up thickness so that it has hardness comparable as metal.

Figure 15:
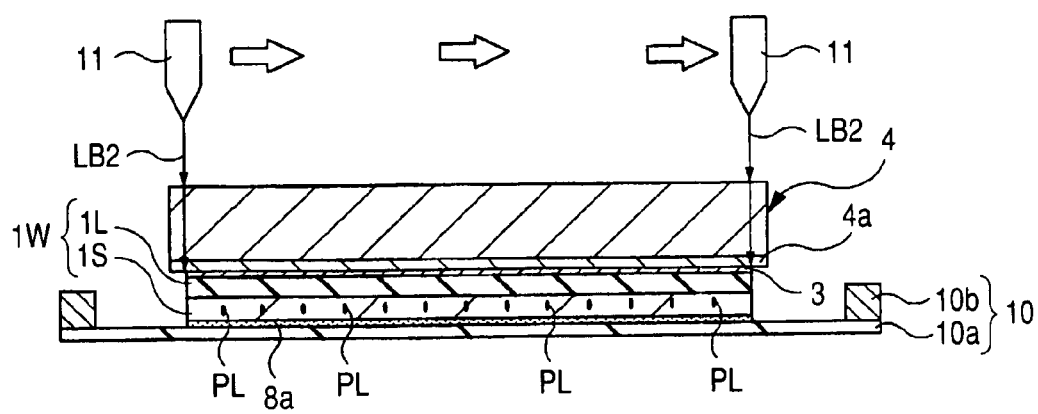
FIG. 15 is a cross-sectional view of the semiconductor wafer at the time of the WSS peeling process of the chip division step of FIG. 1.
Figure 16:
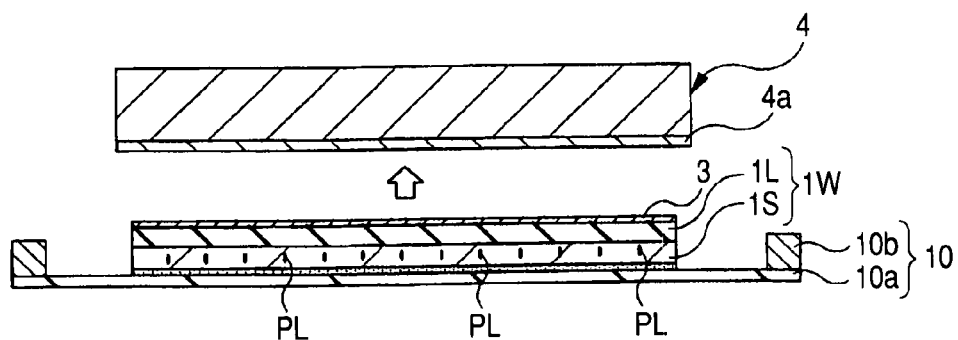
FIG. 16 is a cross-sectional view of the semiconductor wafer at the time of the WSS peeling process of the FIG. 1 following FIG. 15.
Figure 17:
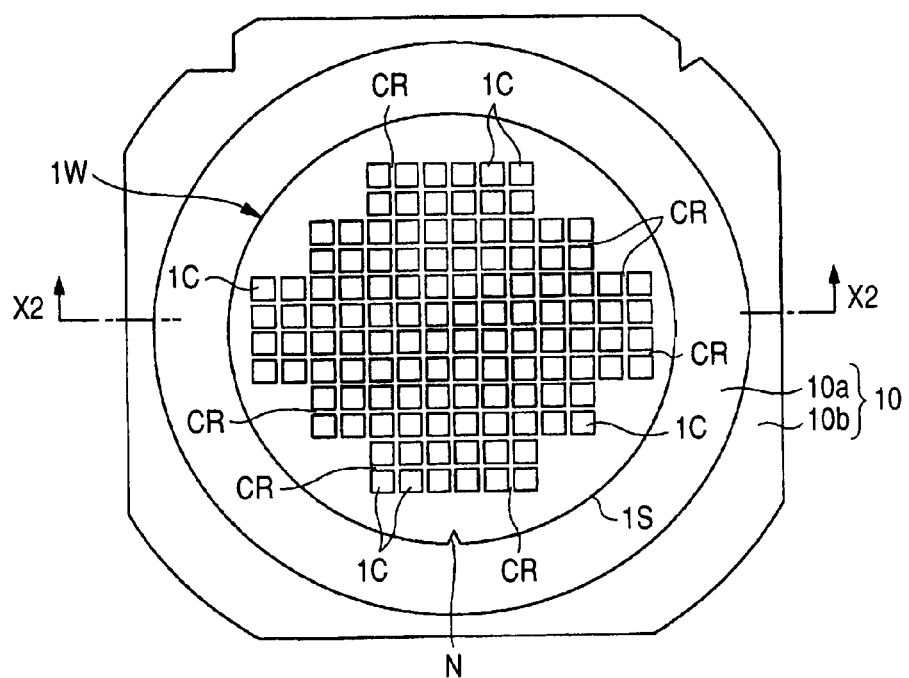
FIG. 17 is a whole plan view of the main surface of a semiconductor wafer and the jig on which this was stuck after the wafer mounting step of FIG. 1.
Figure 18:
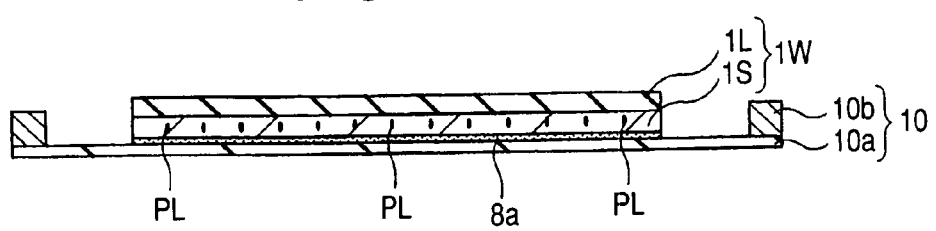
FIG. 18 is a cross-sectional view of X2-X2 line of FIG. 17.

Next, FIG. 15-FIG. 18 show the appearance of wafer 1W at the time of WSS peeling process 102B4 of chip division step 102B. FIG. 15 and FIG. 16 show the cross-sectional view of wafer 1W, FIG. 17 shows the whole main surface plan view of wafer 1W, and FIG. 18 shows the cross-sectional view of X2-X2 line of FIG. 17, respectively.

At this step, first, as shown in FIG. 15, where a focus is put in adhesive layer 3 on the main surface of wafer 1W, laser beam LB2 emitted from laser generating part 11 is scanned and irradiated from one end to the other end of the main surface of wafer 1W via transparent supporting substrate 4. The conditions of this laser beam LB2 are infrared laser with a wave length of 1064 nm, output: 20 W, irradiation rate: 2000 mm/s, and spot diameter: about f200 □m, for example. This peels supporting substrate 4 from the main surface of wafer 1W, as shown in FIG. 16.

Adhesive layer 3 may includes, for example ultraviolet curing resin (UV resin). Having powerful adhesion, UV resin has a characteristic in which cure is promoted and adhesion becomes weak rapidly, when ultraviolet rays are irradiated. When UV resin is used, as for the above-mentioned laser beam LB2, ultraviolet laser is used instead of infrared laser. Hereby, since the adhesion of adhesive layer 3 can be weakened, supporting substrate 4 can be peeled easily. Then, as shown in FIG. 17 and FIG. 18, adhesive layer 3 on the main surface of wafer 1W is removed.

Figure 19:
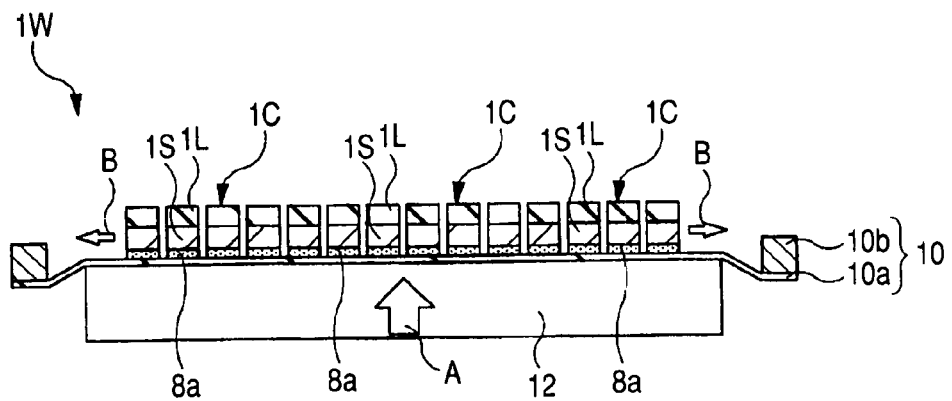
FIG. 19 is a cross-sectional view of the semiconductor wafer at the time of the division step of the chip division step of FIG. 1.
Figure 20:
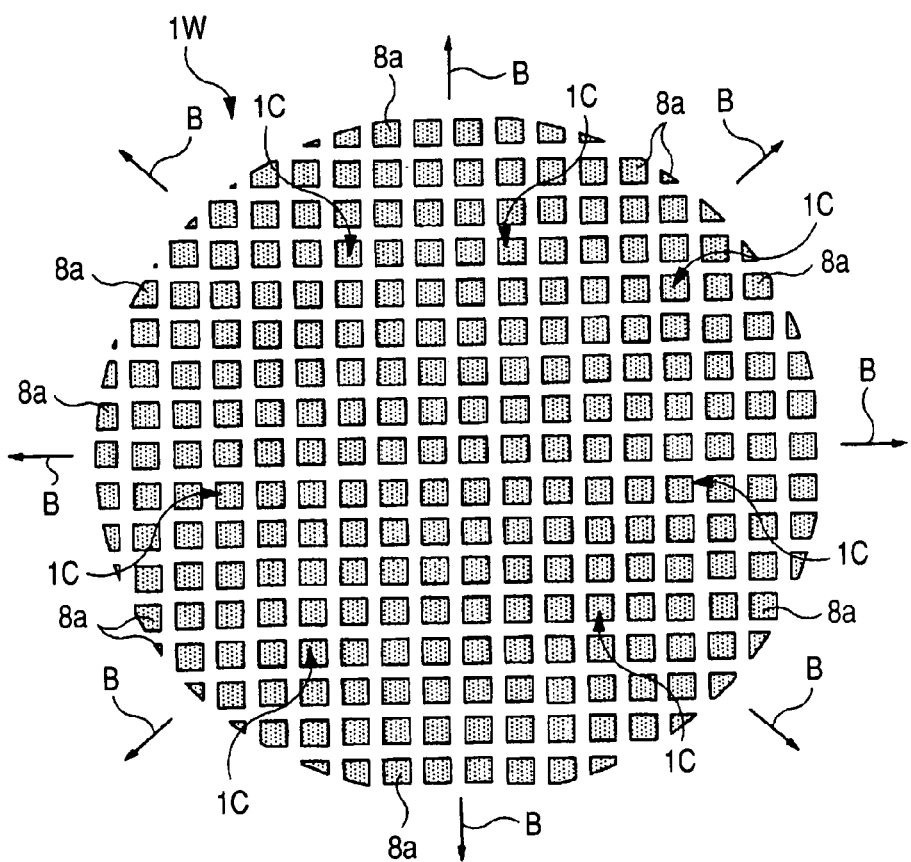
FIG. 20 is the whole back surface plan view of the semiconductor wafer at the time of the division step of FIG. 1.

Next, FIG. 19 and FIG. 20 show the cross-sectional view of wafer 1W and the whole back surface plan view of wafer 1W at the time of division step 102B5. Although FIG. 20 was a plan view, in order to make a drawing legible, hatching was given to the formation area of adhesive layer 8a.

At this step, as shown in FIG. 19, after putting jig 10 which mounted wafer 1W on mounting base 12, where ring 10b of jig 10 is fixed, mounting base 12 is pushed up in the direction (direction shown by arrow A) vertical to the main surface of wafer 1W. Then, as a result of tape's 10a being extended to the diametral direction (direction shown by arrow B) of wafer 1W, a crack enters along the thickness direction of wafer 1W by the force in which the tape 10a is prolonged, by making reforming area PL of wafer 1W into a division origin. This divides wafer 1W into each chip (second chip) 1C (stealth dicing). Adhesive layer 8a also breaks between each chips 1C by division of chip 1C simultaneously. When DAF material is used as an adhesive layer of the back surface of chip 1C, in cutting of chip 1C by stealth dicing, there is a case that the DAF material of the back surface of chip 1C cannot be cut well, such as the case that the peripheral part of the DAF material of the back surface of chip 1C extends without cutting. On the other hand, in Embodiment 1, since the thickness of adhesive layer 8a is very thin compared with DAF material as mentioned above, adhesive layer 8a can be well cut finely at the time of division of chip 1C by stealth dicing. Therefore, since stealth dicing is employable, it can correspond to the thickness reduction of chip 1C, and a semiconductor device can be made thin. Since the external appearance failure of chip 1C can be reduced, the yield of a semiconductor device can be improved.

Since it will become easy to generate a chipping at the time of cutting, and the die strength of a chip will fall when wafer 1W becomes thin in the case of the Blade Dicing Method which cuts wafer 1W by a dicing blade, it is forced to process from a viewpoint of securing the quality of chip 1C, at a low speed (for example, about 60 mm/s, or less than it depending on the thickness of wafer 1W). On the other hand, since in the case of Embodiment 1 damage is not done to the front surface of wafer 1W but splitting only of the inside is made, the chipping which exists in the front surface of chip 1C can be suppressed to the minimum. For this reason, the die strength of chip 1C can be improved. Since cutting processing as high-speed as 300 mm/s, for example can be performed, a throughput can be improved.

As mentioned above, when irradiating a laser beam from the main surface side of wafer 1W, pad 1LBt for a test may become obstructive, and processing of the portion (formation of a reforming layer) may not be able to be performed well at cutting area CR of the main surface of wafer 1W. On the other hand, in Embodiment 1, since laser beam LB is irradiated from the back surface side of wafer 1W in which metals, such as pad 1LBt for a test, do not exist, reforming area PL can be formed good, without generating the above trouble, and wafer 1W can be cut good.

Figure 21:
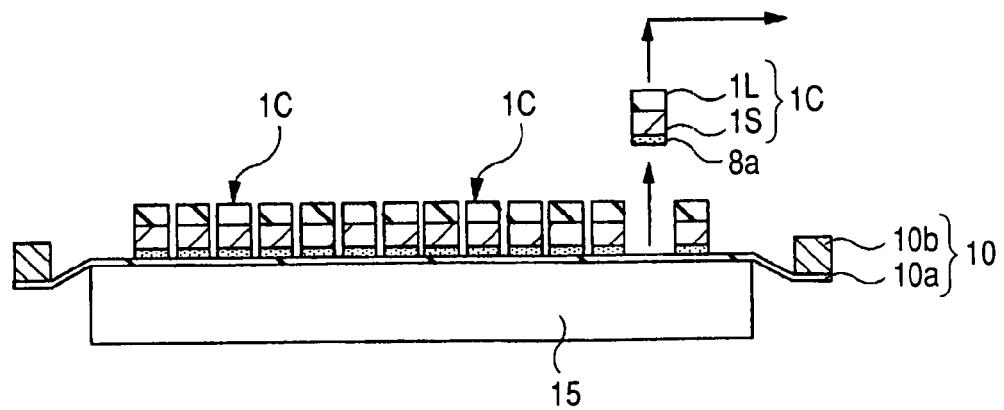
FIG. 21 is a cross-sectional view of the semiconductor wafer at the time of the picking-up step of the assembly process of FIG. 1.

Next, FIG. 21 shows the cross-sectional view of wafer 1W at the time of picking-up step 102C1 of assembly process 102C. At this step, jig 10 holding a plurality of chips 1C is transported to a pickup device and mounted on mounting base 15. Then, where vacuum suction of the back surface of tape 10a of jig 10 is made, chip 1C is pushed up from the back surface of tape 10a by a push-up pin. When the above-mentioned UV tape is used as tape 10a at this time, by irradiating ultraviolet rays to the adhesive layer of tape 10a, an adhesive layer is cured and adhesive strength is weakened. In this state, vacuum suction of the chip 1C is made with the collet of a pickup device, and it is pulled up.

Figure 22:
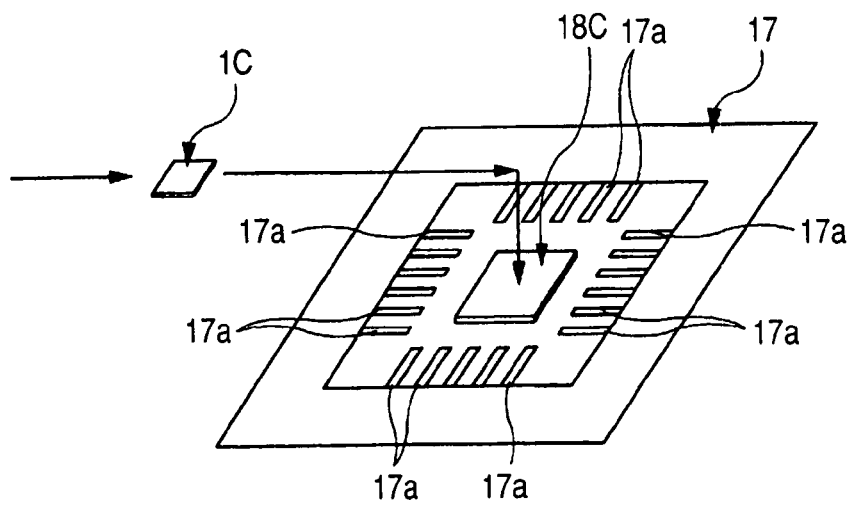
FIG. 22 is a perspective view of the semiconductor chip at the time of the die-bonding step of the assembly process of FIG. 1.
Figure 23:
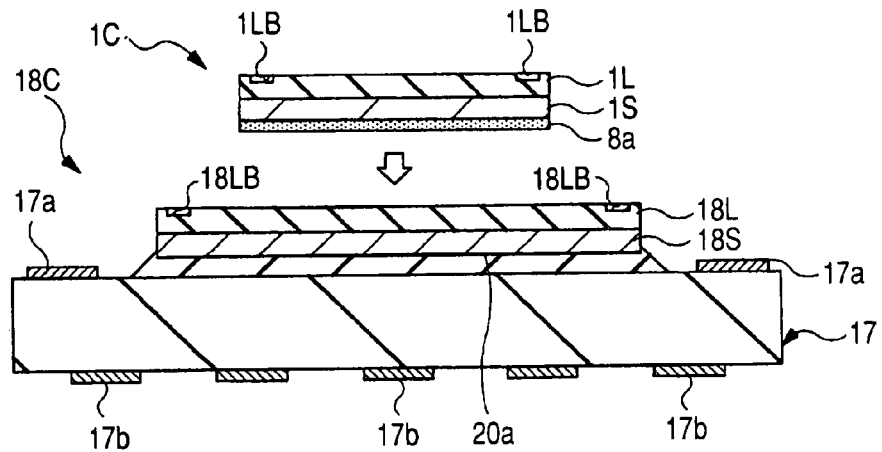
FIG. 23 is a cross-sectional view of the semiconductor chip at the time of the die-bonding step of the assembly process of FIG. 1.

Next, FIG. 22 shows the perspective view of chip 1C and wiring substrate 17 at the time of die-bonding step 102C2 of assembly process 102C, and FIG. 23 shows the cross-sectional view of chip 1C and wiring substrate 17 at the time of the step of FIG. 22. At this step, chip 1C which was picked up as mentioned above is transported on the main surface of other chips (first chip) 18C mounted on the main surface of wiring substrate 17, as shown in FIG. 22 and FIG. 23. Then, chip 1C is descended in the state where adhesive layer 8a of the back surface of chip 1C and the main surface of chip 18C were made to face, and it is put on the main surface of chip 18C. Then, when the base material of adhesive layer 8a is thermoplastic resin, chip 1C is adhered on the main surface of chip 18C by being in the state which heats adhesive layer 8a, made it soften, and gave adhesive property, and pushing and attaching lightly adhesive layer 8a of the back surface of chip 1C on the main surface of chip 18C. Although the heating temperature in particular at this time is not limited, it is about 400° C. On the other hand, when the base material of adhesive layer 8a is thermosetting resin, adhesive layer 8a is hardened thoroughly being applied heat, and chip 1C is adhered on the main surface of chip 18C. Thus, chip 1C is piled up on chip 18C.

Thus, in Embodiment 1, since thickness of adhesive layer 8a of the back surface of chip 1C can be made thin in addition to the thickness reduction of chip 1C, the lamination height of chips 1C and 18C can be made low. Therefore, the semiconductor device having the structure which laminated chips 1C and 18C can be made thin. Since the absorbed amount of the moisture can also be reduced since adhesive layer 8a is thin, and the generation of void can also be reduced, the reliability of a semiconductor device can also be improved. The problem that adhesive layer 8a covers the pad of lower chip 18C is not generated, either without overflowing into the periphery of chip 1C at the time of mounting of chip 1C, since adhesive layer 8a is made into solid state. Adhesive layer 8a of the back surface of chip 1C does not crawl up to a main surface through the side face of chip 1C, even if chip 1C is thin. In addition to that the thickness accuracy of adhesive layer 8a is high, the upper chip 1C does not incline. Chip 1C which was picked up is accommodated in a transportation tray, transportation shipment to other manufacturing factories (for example, assembly fabricator) may be made and the assembly after this step may be requested (step 103A of FIG. 1).

Here, an example of the structure and the mounting method of wiring substrate 17 and chip 18C is explained. Wiring substrate 17 includes a printed-circuit board which has multilayer interconnection structure, for example, and has the main surface and back surface which become the opposite side mutually along a thickness direction. Chip 18C is mounted on the main surface of wiring substrate 17. A plurality of electrodes 17a are arranged on the main surface of wiring substrate 17, so that the periphery of chip 18C may be surrounded. On the back surface of wiring substrate 17, a plurality of electrodes 17b are arranged. Electrode 17a of a main surface and electrode 17b of the back surface of wiring substrate 17 are electrically connected through the wiring of the inner layer of wiring substrate 17. Electrodes 17a and 17b and a wiring of wiring substrate 17 include copper, for example. Gold (Au) plating of nickel (Ni) foundation is performed to the exposed surface of electrodes 17a and 17b.

The structure of chip 18C is almost the same as the abovementioned chip 1C. Substrate 18S of chip 18C includes a silicon (Si) single crystal, for example, and the element and wiring layer 18L are formed in the main surface. The structure of wiring layer 18L is the same as wiring layer 1L of the above-mentioned chip 1C, and pad 18LB is arranged at the top layer. Chip 18C is mounted on the main surface of wiring substrate 17 in the state of turning the main surface upwards and adhering the back surface to the main surface of wiring substrate 17 by adhesive layer 20a. Adhesive layer 20a includes, for example thermoplastic resin like polyimide resin. The thickness of adhesive layer 20a is thicker than adhesive layer 8a of the back surface of the above-mentioned chip 1C, for example, is more than or equal to 10 □m. The reason is for making adhesive layer 20a absorb the big irregularity by the wiring and electrode which were formed on the main surface of wiring substrate 17. When semiconductor chip 18C of the first stage is mounted via adhesive layer 8a formed with the resin coating method, since the thickness of adhesive layer 8a is thin such as about 5 □m, the irregularity formed on the main surface of wiring substrate 17 cannot be absorbed by adhesive layer 8a. That is, a clearance may generate between the main surface of wiring substrate 17, and adhesive layer 8a, and the problem of the void failure that sealing resin becomes non-filling may occur in a later sealing body forming step. As opposed to this, irregularity of the back surface of chip 1C is about 1-2 □m (MAX), for example, and irregularity of the main surface of chip 18C on which chip 1C is laminated is about 1-2 □m (MAX), for example, so that since there is no irregularity like the main surface of wiring substrate 17, it is satisfactory even if adhesive layer 8a of the back surface of chip 1C is made thin.

The mounting method of such a chip 18C is as follows, for example. First, wiring substrate 17 is prepared and a paste state binding material is applied to the chip mounting region of the main surface. This paste state binding material includes, for example thermoplastic resin, such as polyimide resin. Then, after pushing and attaching the back surface of chip 18C on the paste state binding material and mounting chip 18C on the main surface of wiring substrate 17, a paste state binding material is dried and solid-like adhesive layer 20a is formed. This adheres chip 18C to wiring substrate 17.

Figure 58:
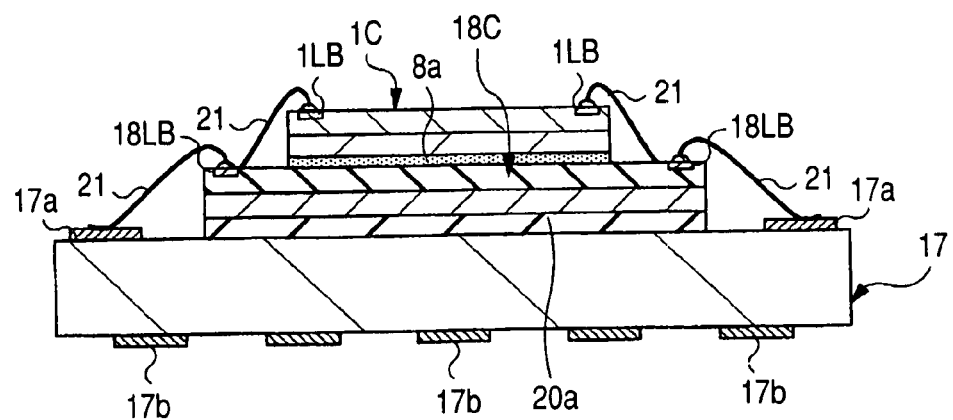

As shown in FIG. 58, DAF (Die Attach Film) may be used as a material of adhesive layer 20a. That is, semiconductor chip 18C of the first stage may be mounted on the main surface of wiring substrate 17 via DAF (adhesive layer 20a), and the semiconductor chip after the second stage mounted on the main surface of the semiconductor chip of the first stage may be mounted via adhesive layer 8a formed with the resin coating method. Since DAF (adhesive layer 20a) used for semiconductor chip 18C of the first stage is made into solid state by this, it does not overflow into the periphery of semiconductor chip 18C at the time of mounting of semiconductor chip 18C. That is, since a binding material (adhesive layer 20a) does not overflow toward electrode 17a arranged on the main surface of a wiring substrate, distance between semiconductor chip 18C and electrode 17a can be shortened, and the miniaturization of a semiconductor device can be realized compared with the case where a paste state binding material is used.

Figure 24:
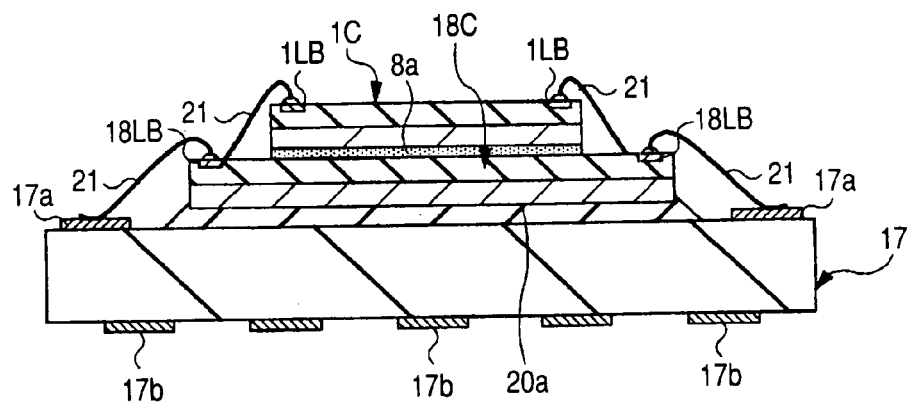
FIG. 24 is a cross-sectional view of the semiconductor device after the wire bonding step of the assembly process of FIG. 1.
Figure 25:
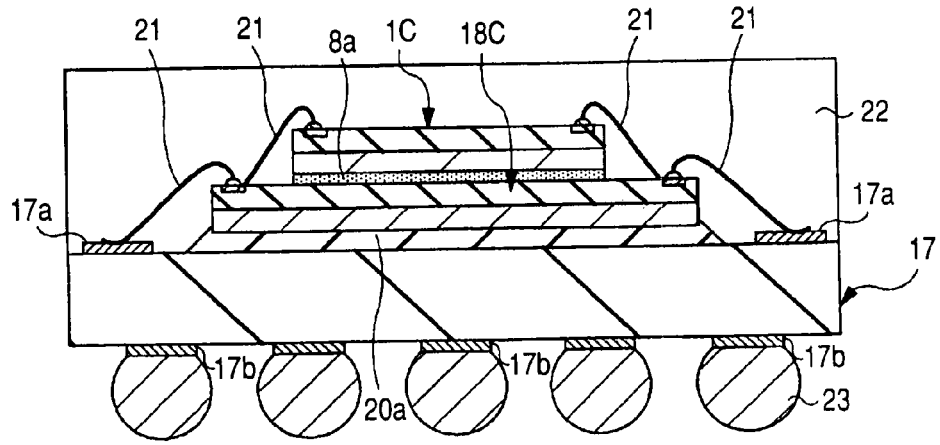
FIG. 25 is a cross-sectional view of the semiconductor device after the molding step of the assembly process of FIG. 1.

Next, FIG. 24 shows the cross-sectional view of the semiconductor device after wire bonding step 102C3 of assembly process 102C, and FIG. 25 shows the cross-sectional view of the semiconductor device after molding step 102C4 of assembly process 102C.

First, in wire bonding step 102C3, as shown in FIG. 24, while connecting pad 1LB of the upper chip 1C, and pad 18LB of lower layer chip 18C by bonding wire (henceforth a wire) 21, pad 18LB of lower layer chip 18C and electrode 17a of wiring substrate 17 are connected with wire 21. Pad 1LB of the upper chip 1C and electrode 17a of wiring substrate 17 may be connected with wire 21. Wire 21 includes, for example gold (Au). Then, in molding step 102C4, as shown in FIG. 25, chips 1C and 18C, wire 21, etc. are sealed by sealing body 22 which includes epoxy system resin etc., for example using the transfer mold method. Solder ball 23 is formed as an external terminal on electrode 17b. Solder ball 23 includes the lead solder material of lead (Pb)-tin (Sn), or the lead free solder material of for example, tin (Sn)-silver (Ag)-copper (Cu) system, for example. A semiconductor device is manufactured as mentioned above.

Embodiment 2

In Embodiment 2, like the Embodiment 1, after passing through laser irradiation step 102B1 from preceding process 100 of FIG. 1, in adhesive layer forming step 102B2 of chip division step 102B, an adhesive layer is formed on the back surface of a wafer by the printing method.

Figure 26:
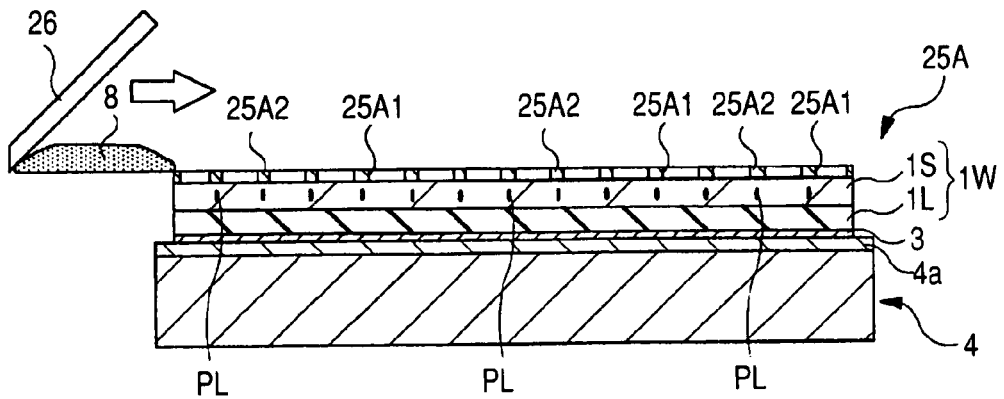
FIG. 26 is a cross-sectional view of the semiconductor wafer at the time of the adhesive layer forming step of the FIG. 1 in the manufacturing process of a semiconductor device which is an other embodiment of the present invention.
Figure 27:
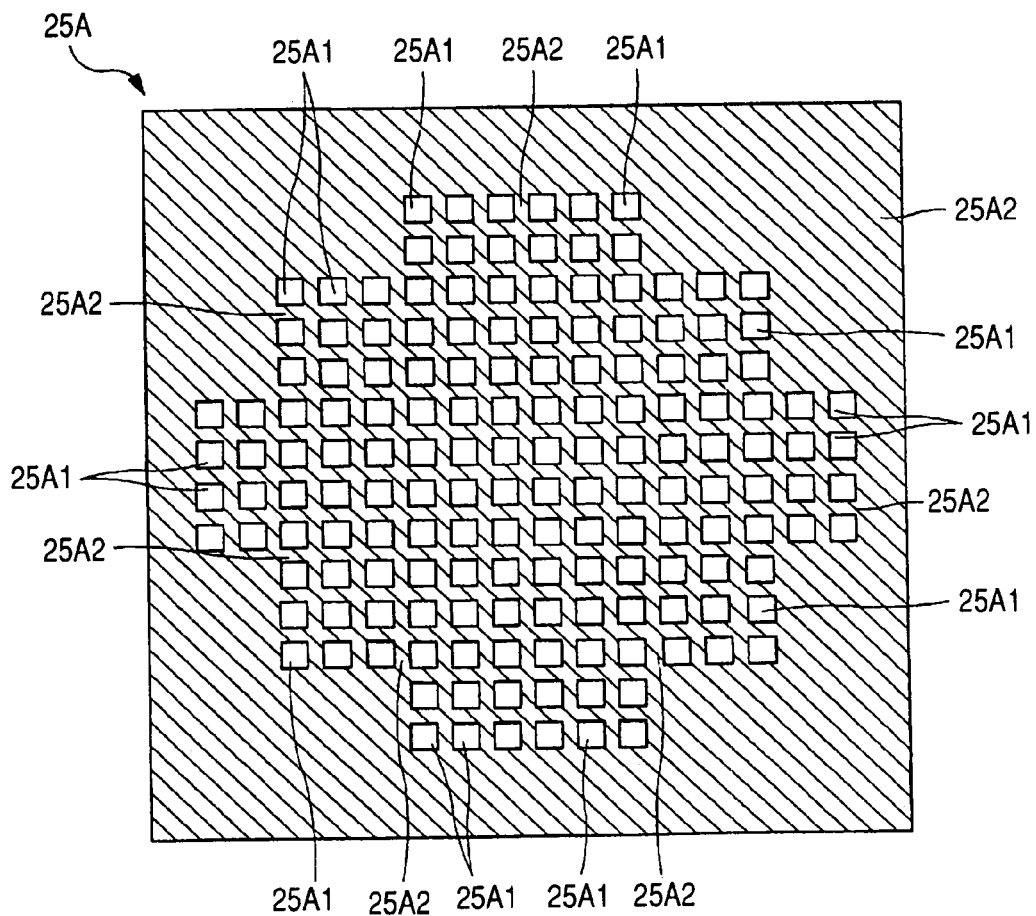
FIG. 27 is a plan view of the mask used at the time of the adhesive layer forming step of FIG. 26.

FIG. 26 shows the cross-sectional view of wafer 1W at the time of the above-mentioned adhesive layer forming step 102B2, and FIG. 27 shows the plan view of mask 25A used at the time of the above-mentioned adhesive layer forming step 102B2. Although FIG. 27 was a plan view, in order to make a drawing legible, hatching was given to mask 25A.

First, on the back surface of wafer 1W, as shown in FIG. 26, after putting mask 25A where alignment is made, squeegee 26 extends binding material 8 of liquid state (paste state) along the back surface of wafer 1W from on this mask 25A. In mask 25A, as shown in FIG. 26 and FIG. 27, opening 25A1 of the almost same plane size as each chip 1C is formed in the correspondence location of each chip 1C of wafer 1W, and the back surface of each chip 1C is exposed to it from each of the opening 25A1. In mask 25A, mask pattern 25A2 is formed in the correspondence location of cutting area CR (formation area of reforming area PL) between contiguity of each chip 1C of wafer 1W, and, hereby, the portion corresponding to cutting area CR between contiguity of chip 1C is covered.

Figure 28:
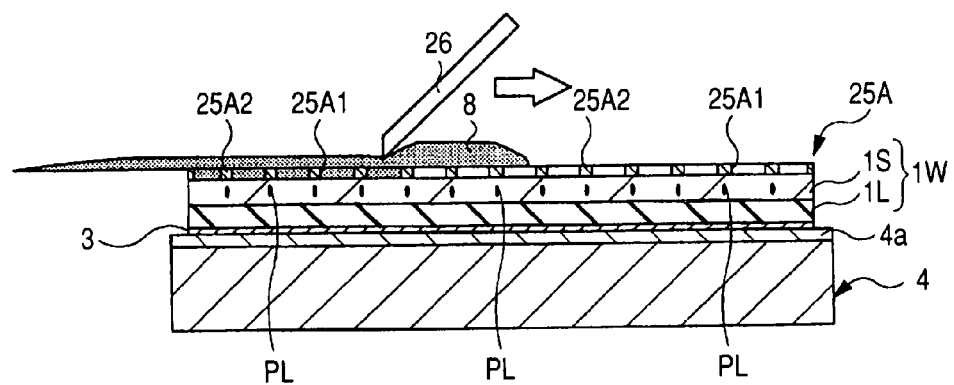
FIG. 28 is a cross-sectional view of the semiconductor wafer at the time of the adhesive layer forming step following FIG. 26.
Figure 29:
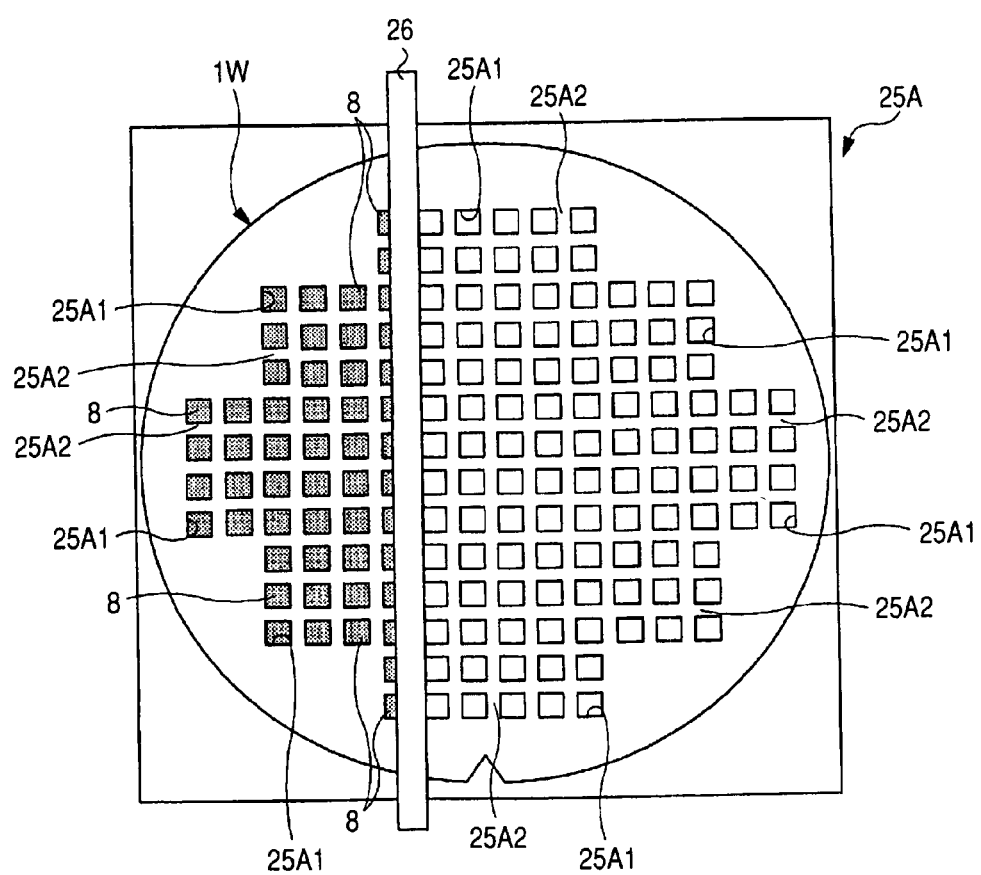
FIG. 29 is a plan view of the back surface side of the semiconductor wafer of FIG. 28.

Next, FIG. 28 shows the cross-sectional view of wafer 1W showing a state that squeegee 26 extended binding material 8 of liquid state, and it is applied to the back surface of wafer 1W selectively via mask 25A, and FIG. 29 shows the plan view of the back surface side of wafer 1W of FIG. 28. Although FIG. 29 was a plan view, in order to make a drawing legible, hatching was given to the coating region of binding material 8. In FIG. 29, in order to make a drawing legible, wafer 1W is shown looking through.

As shown in FIG. 28 and FIG. 29, when squeegee 26 is moved extending binding material 8 along the back surface of wafer 1W, binding material 8 of liquid state will enter in opening 25A1 of mask 25A. Hereby, although binding material 8 adheres to the back surface of chip 1C, it does not adhere to cutting area CR. Thus, squeegee 26 is moved from one end to the other end of wafer 1W.

Figure 30:
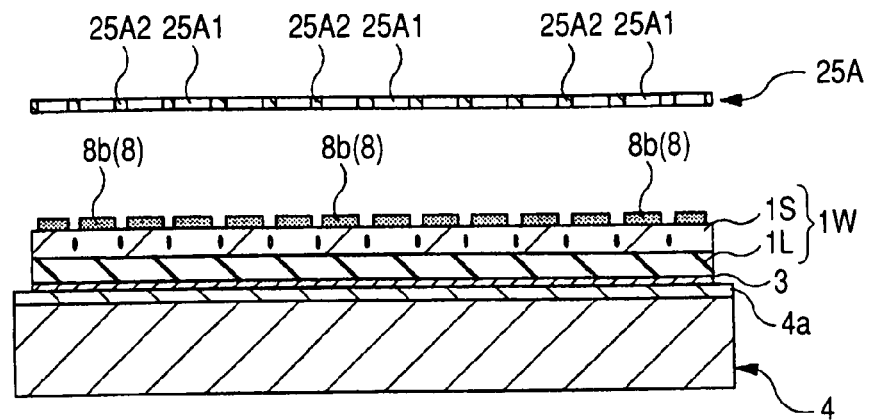
FIG. 30 is a cross-sectional view of the semiconductor wafer at the time of the adhesive layer forming step following FIG. 28.
Figure 31:
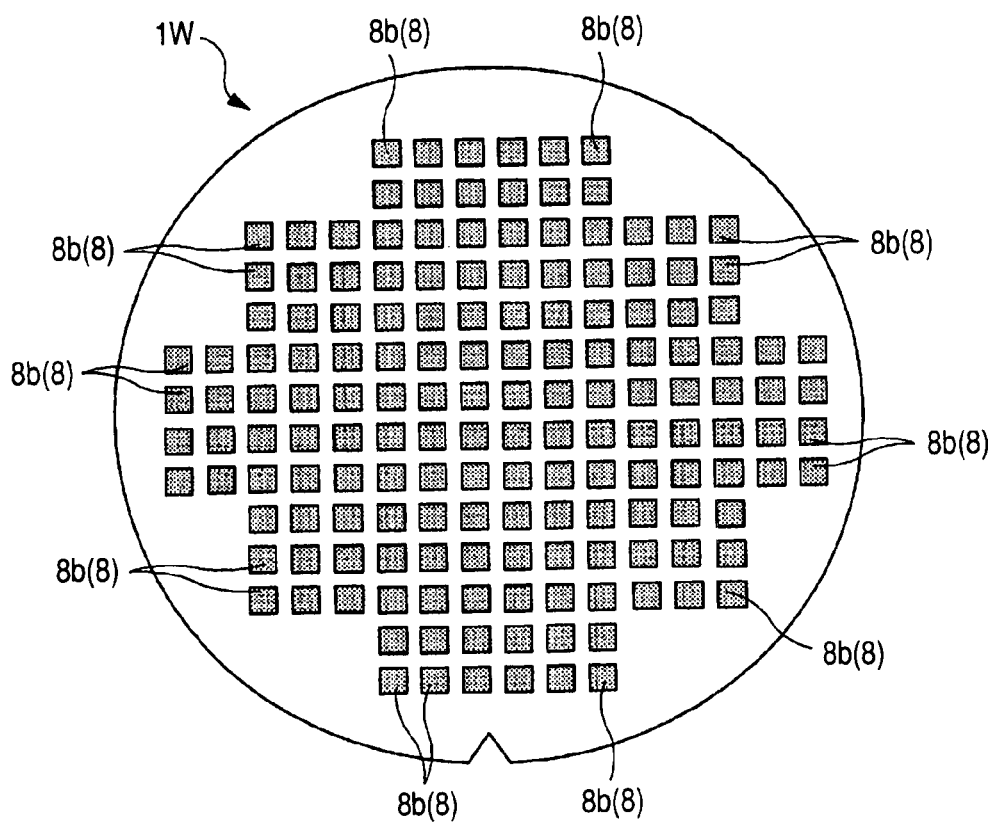
FIG. 31 is a plan view of the back surface of the semiconductor wafer of FIG. 30.

Next, FIG. 30 shows the cross-sectional view of wafer 1W showing the state where mask 25A was removed, and FIG. 31 shows the plan view of the back surface of wafer 1W of FIG. 30. Although FIG. 31 was a plan view, in order to make a drawing legible, hatching was given to the coating region of binding material 8 (adhesive layer 8b).

After applying binding material 8 to the back surface of wafer 1W, solid-like adhesive layer 8b is selectively formed in the region of respective chips 1C of the back surface of wafer 1W by removing mask 25A and drying binding material 8 like the Embodiment 1. Adhesive layer 8b is not formed in cutting area CR.

Figure 32:
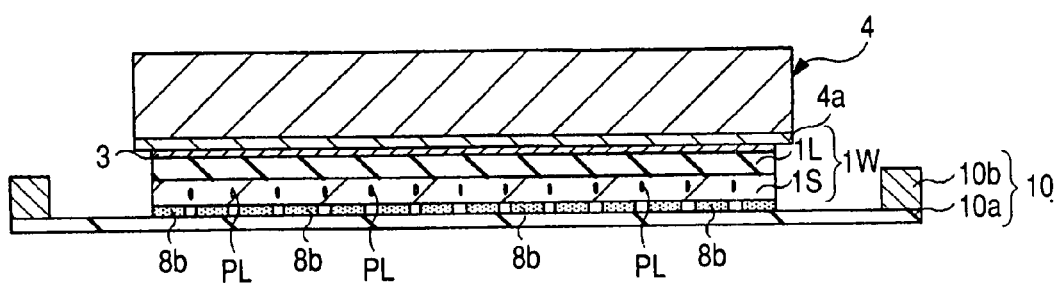
FIG. 32 is a cross-sectional view of the semiconductor wafer at the time of the wafer mounting step of the chip division step following FIG. 30.
Figure 33:
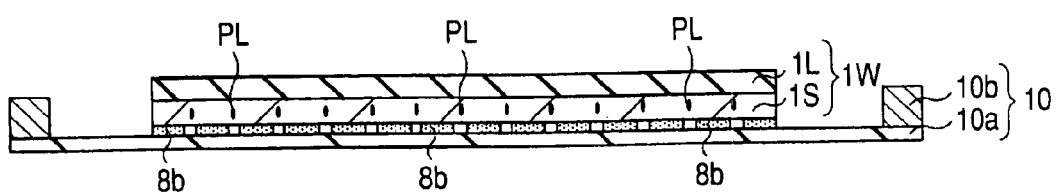
FIG. 33 is a cross-sectional view of the semiconductor wafer after the WSS peeling process following FIG. 32.

Next, FIG. 32 shows the cross-sectional view of wafer 1W at the time of wafer mounting step 102B3 of chip division step 102B, and FIG. 33 shows the cross-sectional view of wafer 1W after WSS peeling process 102B4.

At this step, as shown in FIG. 32, like the Embodiment 1, after sticking the back surface (formation surface of adhesive layer 8b) of wafer 1W on tape 10a of jig 10, as shown in FIG. 33, supporting substrate 4 is peeled, then adhesive layer 3 is removed like the Embodiment 1.

Figure 34:
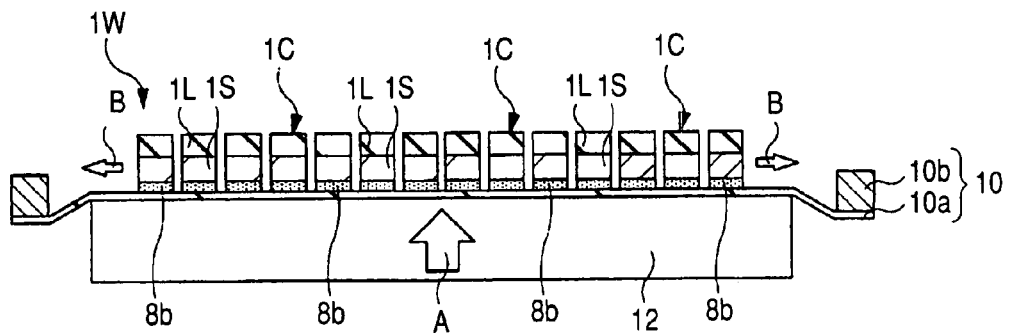
FIG. 34 is a cross-sectional view of the semiconductor wafer at the time of the division step following FIG. 33.
Figure 35:
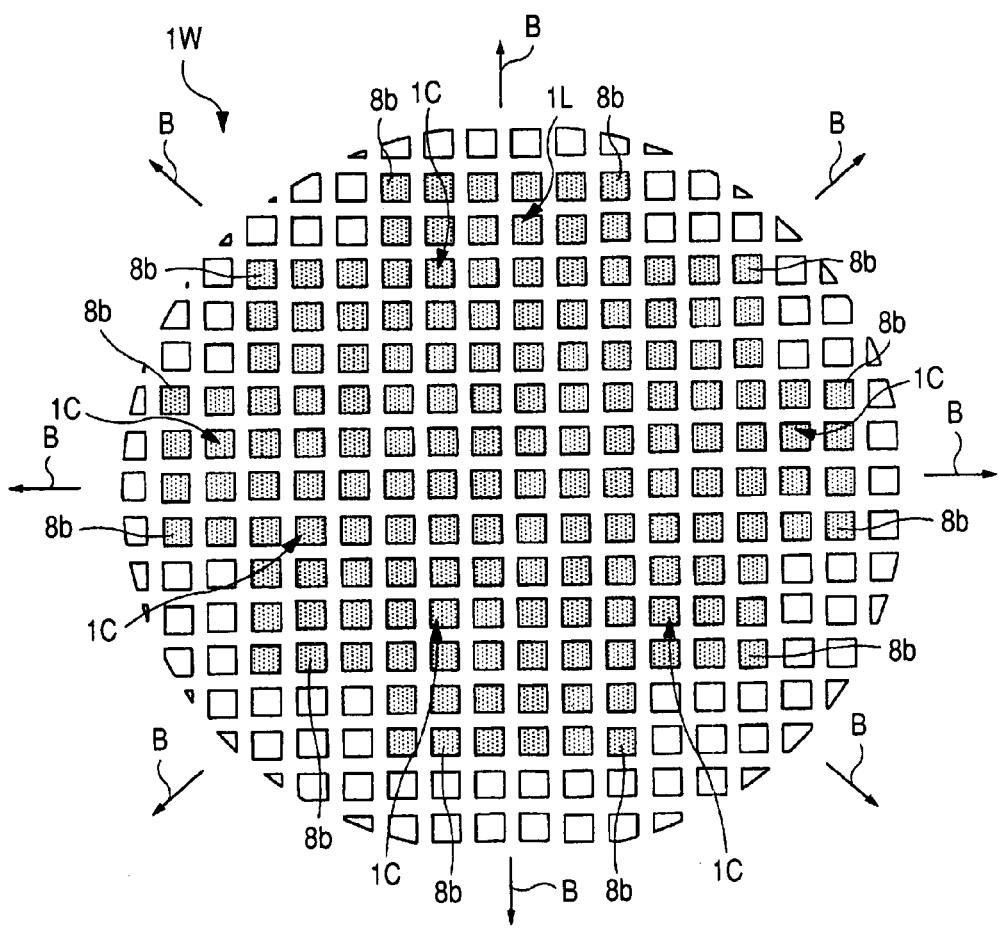
FIG. 35 is the whole back surface plan view of the semiconductor wafer of FIG. 34.

Next, FIG. 34 and FIG. 35 show the cross-sectional view of wafer 1W and the whole back surface plan view of wafer 1W at the time of division step 102B5. Although FIG. 35 was a plan view, in order to make a drawing legible, hatching was given to the formation area of adhesive layer 8b.

At this step, as shown in FIG. 34 and FIG. 35, wafer 1W is divided into each chip (second chip) 1C like the Embodiment 1 by making reforming area PL of wafer 1W into a division origin (stealth dicing). At this time, in Embodiment 2, since adhesive layer 8b is already divided into every each chip 1C before division step 102B5, and adhesive layer 8b is not formed at cutting area CR, adhesive layer 8b between chips 1C is finely separable. That is, stealth dicing can divide chip 1C finely, without generating trouble in the peripheral part of adhesive layer 8b of the back surface of chip 1C. Therefore, since stealth dicing is employable, a semiconductor device can be made thin. Since the external appearance failure of chip 1C can be reduced, the yield of a semiconductor device can be improved. The same effect as the Embodiment 1 can be acquired except this.

Since assembly process 102C after this is the same as the Embodiment 1, explanation is omitted.

Embodiment 3

The Embodiment 1 and 2 explained the case where an adhesive layer was formed on the back surface of wafer 1W, after the laser irradiation step for forming reforming area LB in the chip division step. Embodiment 3 explains the case where the laser irradiation step for forming reforming area LB is performed in a chip division step after forming an adhesive layer on the back surface of wafer 1W.

Figure 36:
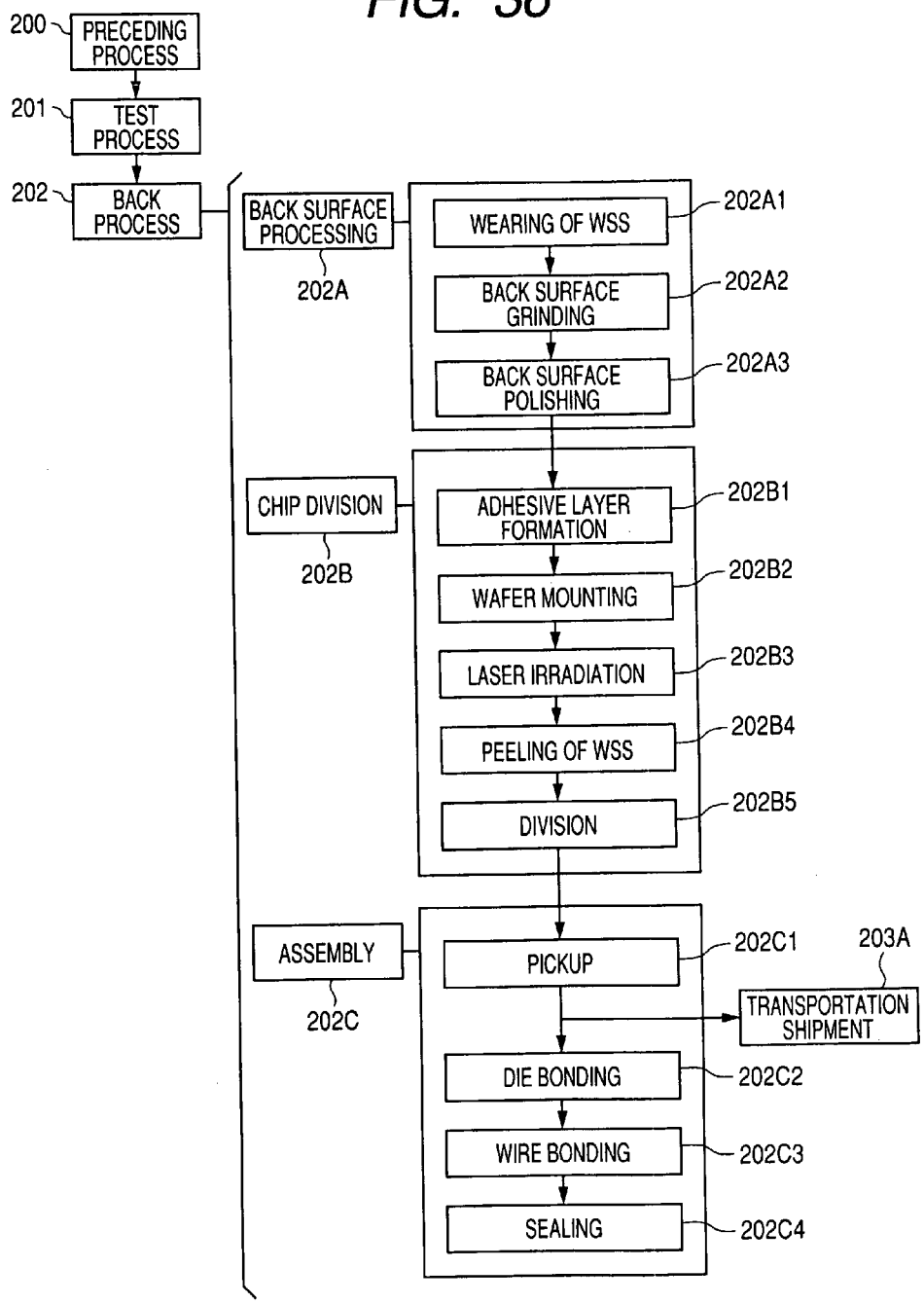
FIG. 36 is a flow diagram of the manufacturing process of a semiconductor device which is a further other embodiment of the present invention.

FIG. 36 shows the flow diagram of the semiconductor device of Embodiment 3. In Embodiment 3, like the Embodiment 1, after passing through preceding process 200 and test process 201 of FIG. 36, wearing step of WSS 202A1, back surface grinding step 202A2, and back surface polishing step 202A3 of back surface processing step 202A of back process 202 are performed in order.

Figure 37:
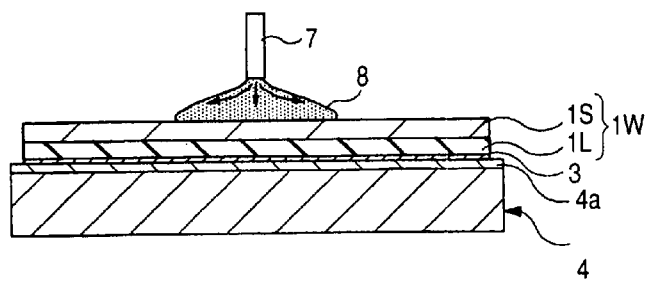
FIG. 37 is a cross-sectional view of the semiconductor wafer at the time of the adhesive layer forming step of the chip division step of FIG. 36.
Figure 38:
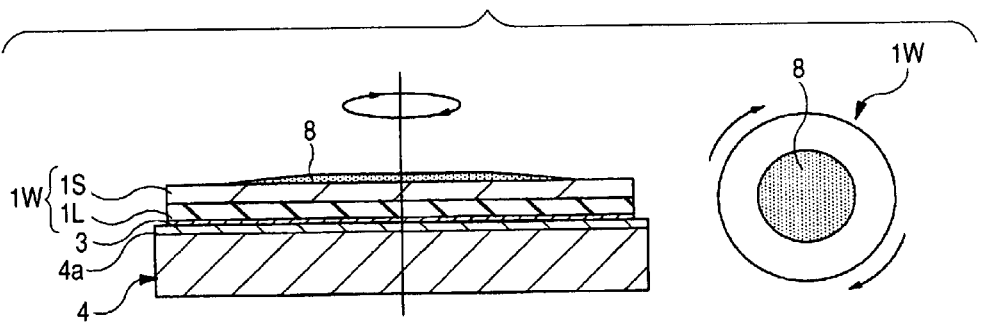
In FIG. 38, left-hand side is a cross-sectional view of the semiconductor wafer at the time of the adhesive layer forming step of the chip division step following FIG. 37, and right-hand side is the whole semiconductor wafer plan view at this time.
Figure 39:
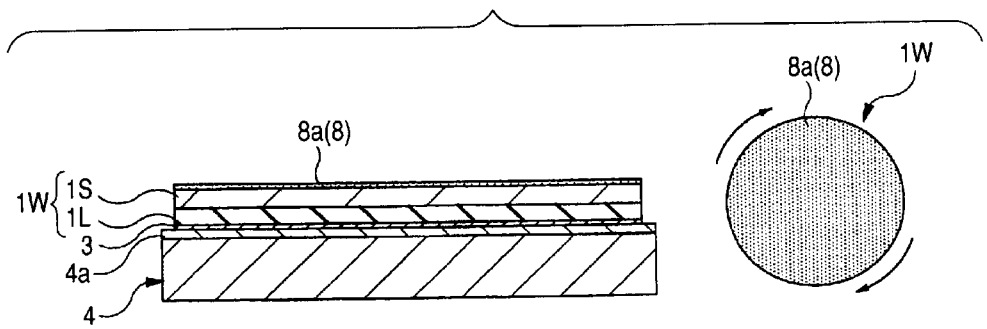
In FIG. 39, left-hand side is a cross-sectional view of the semiconductor wafer at the time of the adhesive layer forming step of the chip division step following FIG. 38, and right-hand side is the whole semiconductor wafer plan view at this time.

Then, in Embodiment 3, in chip division step 202B, before performing the laser irradiation step for forming reforming area PL, adhesive layer forming step 202B1 is performed. FIG. 37-FIG. 39 show appearance of wafer 1W at the time of adhesive layer forming step 202B1 of chip division step 202B. FIG. 37 shows the cross-sectional view of wafer 1W, the left-hand side of FIG. 38 and FIG. 39 shows the cross-sectional view of wafer 1W, and right-hand side shows the whole back surface plan view of wafer 1W, respectively. Although the right-hand side of FIG. 38 and FIG. 39 was a plan view, in order to make a drawing legible, hatching was given to binding material 8 (adhesive layer 8a).

Here, as shown in FIG. 37, like the Embodiment 1, after binding material 8 of liquid state (paste state) is dropped in the center on the back surface of wafer 1W from nozzle 7 of a spin coating apparatus, as shown in FIG. 38, the thin coat of binding material 8 is formed all over the back surface of wafer 1W by making the high velocity revolution of the wafer 1W (spin coating method). Then, like the Embodiment 1, a drying process is performed to binding material 8 of the back surface of wafer 1W, binding material 8 is solidified, and as shown in FIG. 39, thin solid-like adhesive layer 8a is formed all over the back surface of wafer 1W. Hereby, like the Embodiment 1, thin adhesive layer 8a can be formed on the back surface of wafer 1W so that thickness may become uniform.

Figure 40:
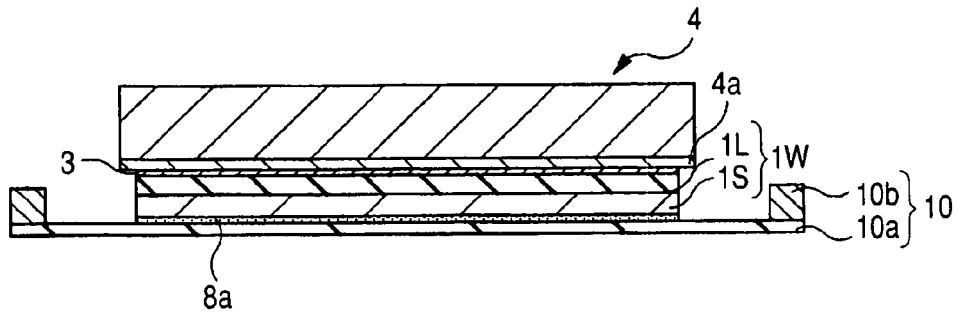
FIG. 40 is a cross-sectional view of the semiconductor wafer at the time of the wafer mounting step of the FIG. 36 following FIG. 39.
Figure 41:
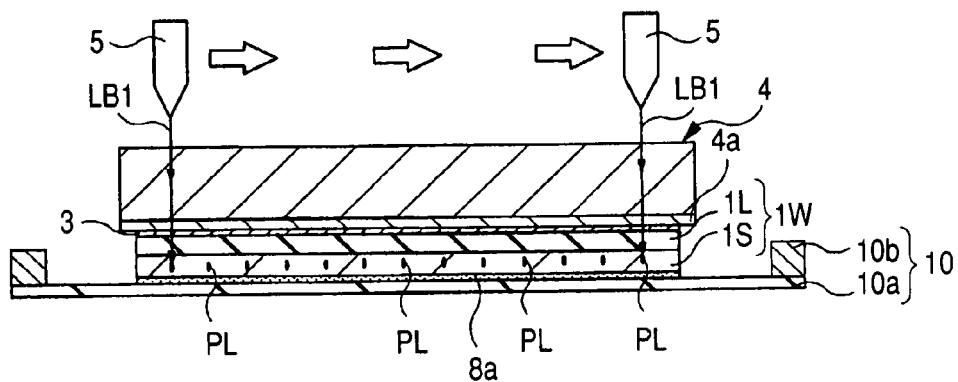
FIG. 41 is a cross-sectional view of the semiconductor wafer at the time of the laser irradiation step of the FIG. 36 following FIG. 40.
Figure 42:
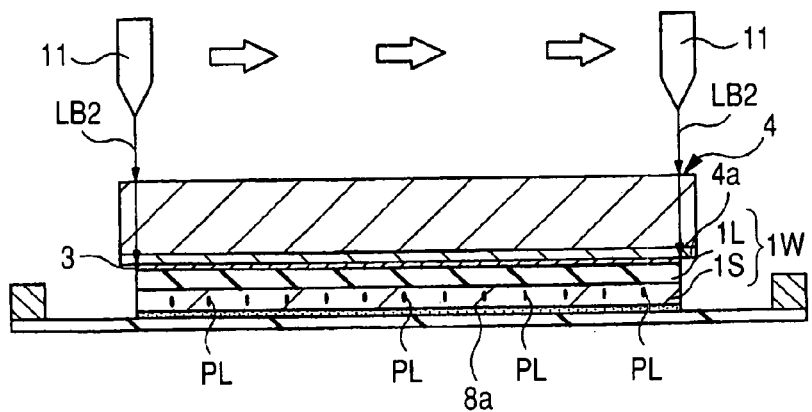
FIG. 42 is a cross-sectional view of the semiconductor wafer at the time of the WSS peeling process of the FIG. 36 following FIG. 41.

Next, FIG. 40 shows the cross-sectional view of wafer 1W at the time of wafer mounting step 202B2 of FIG. 36, FIG. 41 shows the cross-sectional view of wafer 1W at the time of laser irradiation step 202B3 of FIG. 36, and FIG. 42 shows the cross-sectional view of wafer 1W at the time of WSS peeling process 202B4 of FIG. 36, respectively.

First, as shown in FIG. 40, like the Embodiment 1, the back surface (formation surface of adhesive layer 8a) of wafer 1W is stuck on tape 10a of jig 10, and wafer 1W is mounted on jig 10. Then, wafer 1W is transported while being mounted on jig 10 to a laser dicing apparatus, and where the main surface (namely, upper surface of supporting substrate 4) of the wafer 1W is turned upwards, it is laid on a chuck. Then, after recognizing patterns (except the pattern of chip 1C or cutting area CR, pad 1LBt and alignment target Am which are arranged at cutting area CR, pad 1LB arranged in chip 1C, etc.) of the main surface of wafer 1W from the upper part of the main surface of wafer 1W using IR camera, based on the pattern information thereby acquired, alignment (location amendment) of cutting-plane-line CL is carried out.

Then, as shown in FIG. 41, while irradiating laser beam LB1 emitted from laser generating part 5 located in the main surface upper part of wafer 1W from the main surface side of wafer 1W where a condensing point is put together with the inside of substrate 1S of wafer 1W via transparent supporting substrate 4, it is made to move along cutting-plane-line CL to which alignment was made based on the above-mentioned pattern information. This forms above-mentioned reforming area PL in the inside of substrate 1S in cutting area CR of wafer 1W The method of a scan and irradiation conditions of laser beam LB1 are as the same as the Embodiment 1 explained.

Then, as shown in FIG. 42, laser beam LB2 emitted from laser generating part 11 is scanned from one end to the other end of the main surface of wafer 1W via transparent supporting substrate 4, and adhesive layer 3 on the main surface of wafer 1W is irradiated. Hereby, the adhesive strength of adhesive layer 3 is reduced and supporting substrate 4 is peeled from wafer 1W like the Embodiment 1. Then, adhesive layer 3 on the main surface of wafer 1W is removed like the Embodiment 1.

Since division step 202B5, assembly process 202C (picking-up step 202C1, die-bonding step 202C2, wire bonding step 202C3, molding step 202C4), and transportation shipment step 203A after this are the same as each step explained by the Embodiment 1, explanation is omitted.

Embodiment 4

In Embodiment 4, like the Embodiment 3, after passing through preceding process 200 to back surface polishing process 202A3 of FIG. 36, in adhesive layer forming step 202B1 of chip division step 202B, an adhesive layer is formed on the back surface of wafer 1W by the printing method.

Figure 43:
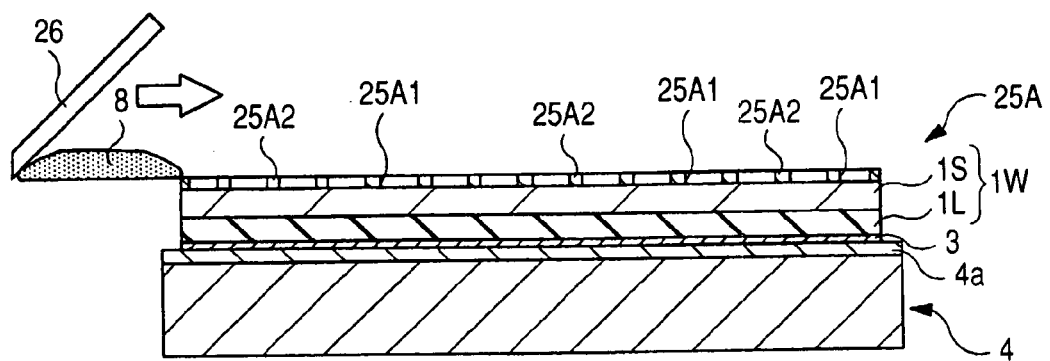
FIG. 43 is a cross-sectional view of the semiconductor wafer at the time of the adhesive layer forming step of the FIG. 36 in the manufacturing process of a semiconductor device which is an other embodiment of the present invention.
Figure 44:
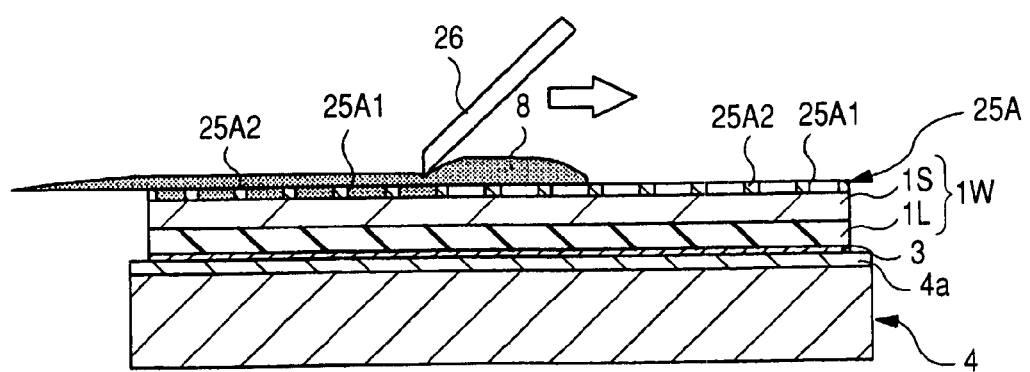
FIG. 44 is a cross-sectional view of the semiconductor wafer at the time of the adhesive layer forming step following FIG. 43.
Figure 45:
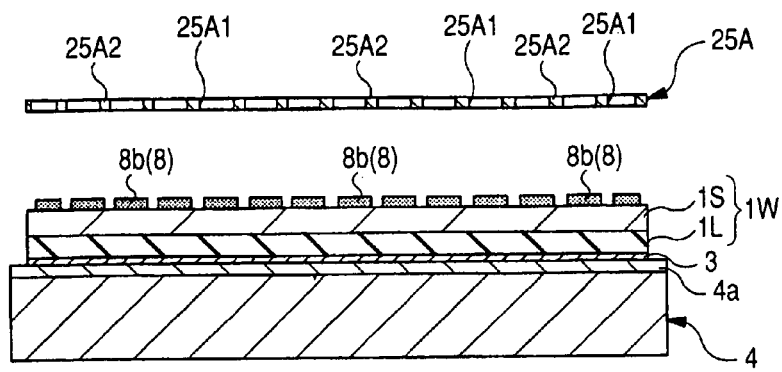
FIG. 45 is a cross-sectional view of the semiconductor wafer at the time of the adhesive layer forming step following FIG. 44.

FIG. 43 shows the cross-sectional view of wafer 1W at the time of the above-mentioned adhesive layer forming step 202B1. FIG. 44 shows the cross-sectional view of wafer 1W in which a state that squeegee 26 extended binding material 8 of liquid state, and it has applied to the back surface of wafer 1W selectively via mask 25A is shown, and FIG. 45 shows the cross-sectional view of wafer 1W in which the state where mask 25A was removed is shown, respectively.

First, like the Embodiment 2, as shown in FIG. 43, after putting mask 25A on the back surface of wafer 1W where alignment is made, squeegee 26 extends binding material 8 of liquid state (paste state) along the back surface of wafer 1W from on this mask 25A. Then, as shown in FIG. 44, like the Embodiment 2, it enters in opening 25A2 of mask 25A, and binding material 8 of liquid state adheres to the back surface of wafer 1W. Thus, after applying binding material 8 to the back surface of wafer 1W selectively, as shown in FIG. 45, mask 25A is removed like the Embodiment 2. Then, solid-like adhesive layer 8b is selectively formed in the region of chip 1C of the back surface of wafer 1W by drying binding material 8 like the Embodiment 1 and 2. Adhesive layer 8b is not formed in cutting area CR.

Figure 46:
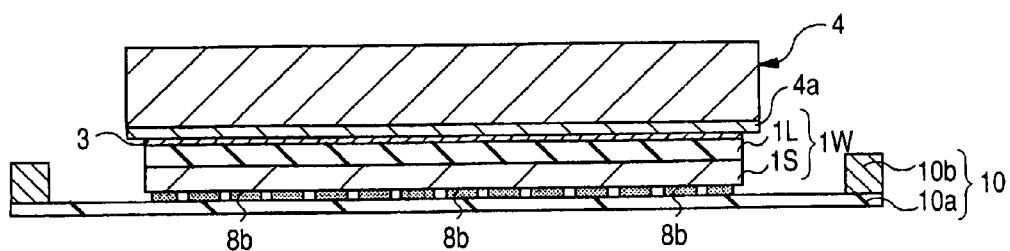
FIG. 46 is a cross-sectional view of the semiconductor wafer at the time of the wafer mounting step following FIG. 45.
Figure 47:
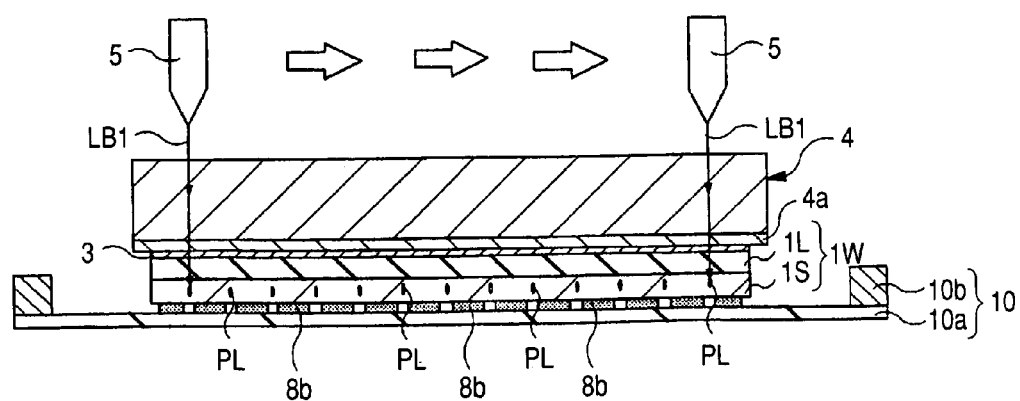
FIG. 47 is a cross-sectional view of the semiconductor wafer at the time of the laser irradiation step following FIG. 46.

Next, FIG. 46 shows the cross-sectional view of wafer 1W at the time of wafer mounting step 202B2 of chip division step 202B, and FIG. 47 shows the cross-sectional view of wafer 1W at the time of laser irradiation step 202B3 of FIG. 36, respectively.

First, like the Embodiments 1-3, as shown in FIG. 46, after sticking the back surface (formation surface of adhesive layer 8b) of wafer 1W on tape 10a of jig 10, the above-mentioned pattern of the main surface of wafer 1W is recognized from the main surface upper part of wafer 1W like the Embodiment 3 using IR camera. And based on the pattern information thereby acquired, alignment (location amendment) of cutting-plane-line CL is carried out. Then, as shown in FIG. 47, like the Embodiment 3, while irradiating laser beam LB1 emitted from laser generating part 5 established in the main surface upper part of wafer 1W from the main surface side of wafer 1W where a condensing point is put together with the inside of substrate 1S of wafer 1W via transparent supporting substrate 4, it is made to move along cutting-plane-line CL to which alignment was made based on the above-mentioned pattern information. This forms above-mentioned reforming area PL in the inside of substrate 1S in cutting area CR of wafer 1W.

Then, like the Embodiment 3, after peeling supporting substrate 4 from the main surface of wafer 1W, adhesive layer 3 on the main surface of wafer 1W is removed, and wafer 1W is divided into each chip 1C like the Embodiments 1-3. Since the step after this is the same as the Embodiment 3, explanation is omitted.

Embodiment 5

Embodiment 5 explains the modification in the case of forming an adhesive layer in the back surface of a wafer by the printing method.

Figure 48:
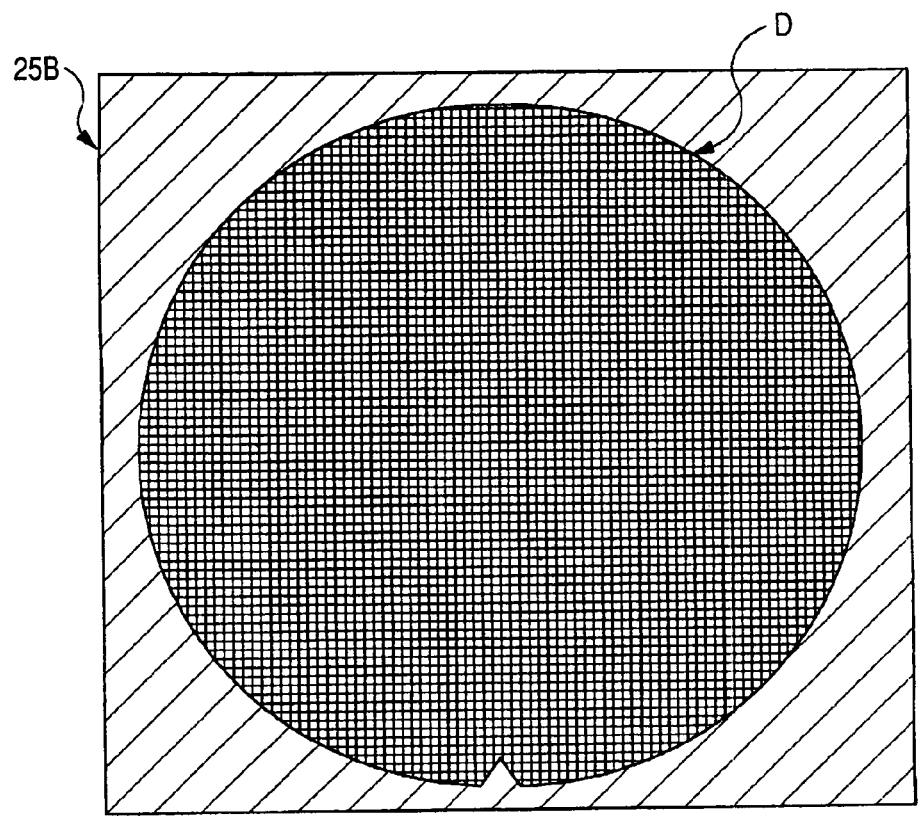
FIG. 48 is a plan view of the mask used at the time of the adhesive layer forming step of the manufacturing process of a semiconductor device which is an other embodiment of the present invention.

FIG. 48 shows the plan view of mask 25B used at the time of the adhesive layer forming step of Embodiment 5. Although FIG. 48 was a plan view, hatching was attached in order to make a drawing legible.

Let the mask pattern of transcriptional region D of mask 25B be a mesh shape fine pattern in Embodiment 5. That is, a plurality of openings smaller than the plane size of chip 1C are arranged in the state where it adjoined in the direction of four directions, in the surface of transcriptional region D in transcriptional region D of mask 25B.

Figure 49:
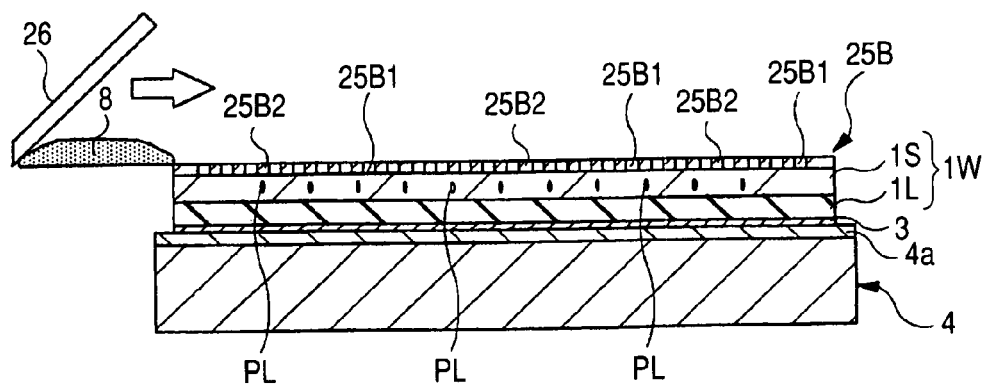
FIG. 49 is a cross-sectional view of the semiconductor wafer at the time of the above-mentioned adhesive layer forming step which used the mask of FIG. 48.
Figure 50:
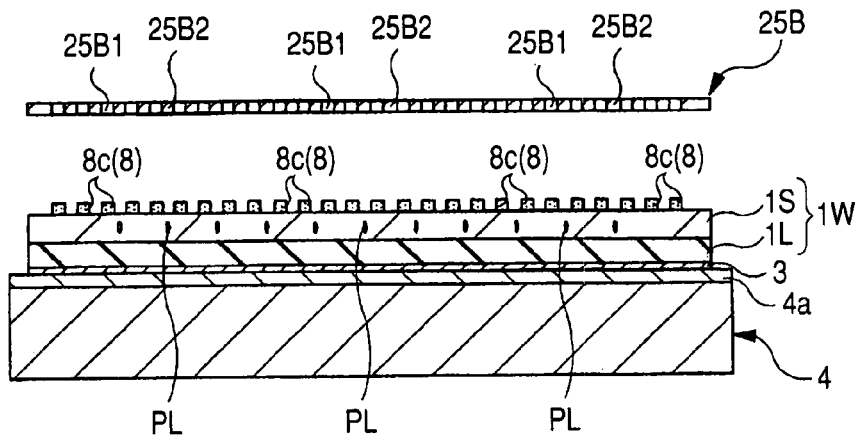
FIG. 50 is a cross-sectional view of the semiconductor wafer at the time of the adhesive layer forming step following FIG. 49.
Figure 51:
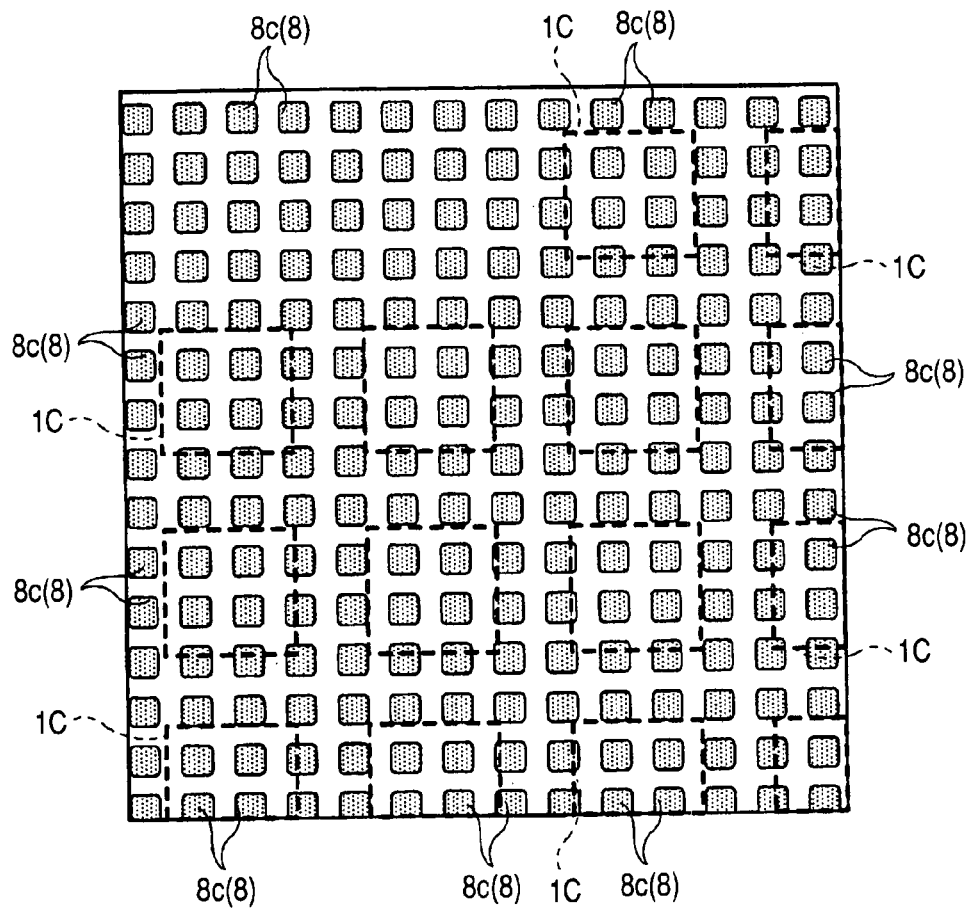
FIG. 51 is a principal part enlarged plan view of the back surface of the semiconductor wafer of FIG. 50.

Next, FIG. 49 shows the cross-sectional view of wafer 1W at the time of the above-mentioned adhesive layer forming step 102B2, FIG. 50 shows the cross-sectional view of wafer 1W in which the state where mask 25B was removed is shown, and FIG. 51 shows the principal part enlarged plan view of the back surface of wafer 1W of FIG. 50, respectively. Although FIG. 51 was a plan view, in order to make a drawing legible, hatching was given to adhesive layer 8b.

First, as shown in FIG. 49, like the Embodiment 2, after putting mask 25B shown in FIG. 48 on the back surface of wafer 1W where alignment is made, binding material 8 of liquid state (paste state) is selectively applied to the back surface of wafer 1W through opening 25B1 of mask 25B, being extended along the back surface of wafer 1W from on mask 25B by squeegee 26. At this time, binding material 8 is not applied to the location corresponding to mask pattern 25B2 of mask 25B in the back surface of wafer 1W.

Thus, after applying binding material 8 to the back surface of wafer 1W selectively, as shown in FIG. 50, mask 25B is removed like the Embodiment 2. Then, a plurality of fine solid-like adhesive layers 8c are selectively formed on the back surface of wafer 1W by drying binding material 8 like the Embodiments 1 and 2. Here, as shown in FIG. 51, the plane area of adhesive layer 8c is extremely smaller than the plane area of chip 1C. For this reason, since a big difference will not be generated in the gross area of adhesive layer 8c arranged in the region of chip 1C even if the location of adhesive layer 8c shifts a little vertically and horizontally rather than the location which was being planned, the total adhesive strength of adhesive layer 8c of the back surface of chip 1C does not fall greatly, either. Since it is fine, and is isolated and each adhesive layer 8c is mutually separated even if the location of adhesive layer 8c shifted a little vertically and horizontally rather than the location which was being planned and adhesive layer 8c is arranged at cutting area CR of wafer 1W, it does not become the hindrance of cutting of wafer 1W. Therefore, the plane alignment accuracy of mask 25B for forming adhesive layer 8c and wafer 1W can be eased.

Figure 52:
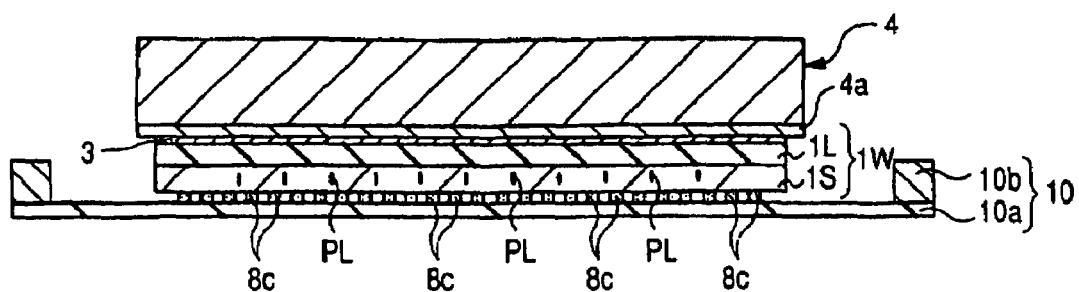
FIG. 52 is a cross-sectional view of the semiconductor wafer at the time of the wafer mounting step following FIG. 50.
Figure 53:
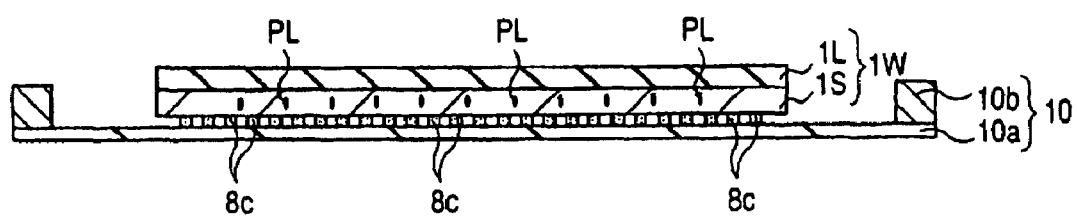
FIG. 53 is a cross-sectional view of the semiconductor wafer after the WSS peeling process following FIG. 52.
Figure 54:
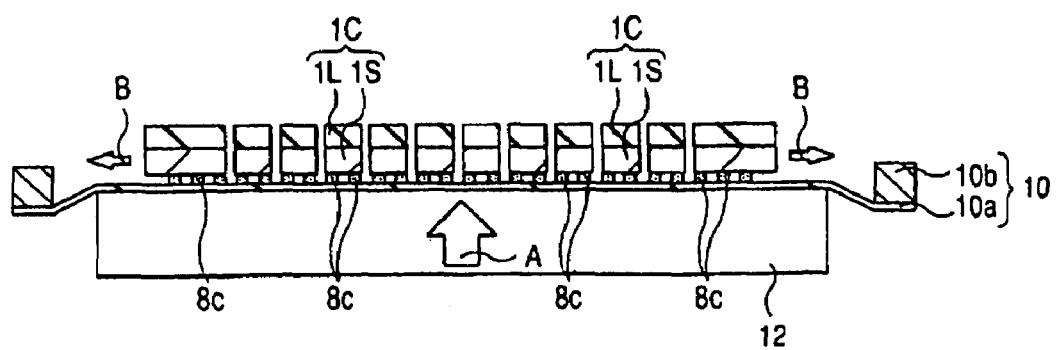
FIG. 54 is a cross-sectional view of the semiconductor wafer at the time of the division step following FIG. 53.

Next, FIG. 52 shows the cross-sectional view of wafer 1W at the time of wafer mounting step 102B3 of chip division step 102B. FIG. 53 shows the cross-sectional view of wafer 1W after WSS peeling process 102B4, and FIG. 54 shows the cross-sectional view of wafer 1W at the time of division step 102B5.

At this step, as shown in FIG. 52, after sticking the back surface (formation surface of adhesive layer 8c) of wafer 1W on tape 10a of jig 10, as shown in FIG. 53, like the Embodiments 1-4, supporting substrate 4 is peeled and adhesive layer 3 is continuously removed like the Embodiments 1-4. Then, as shown in FIG. 54, wafer 1W is divided into each chip 1C like the Embodiment 1-4 by making reforming area PL of wafer 1W into a division origin (stealth dicing). Since adhesive layer 8c is mutually separated by Embodiment 5 smaller than chip 1C at this time, when cutting chip 1C, adhesive layer 8c can also be separated finely. Therefore, since stealth dicing is employable, a semiconductor device can be made thin. Since the external appearance failure of chip 1C can be reduced, the yield of a semiconductor device can be improved. An effect which is the same as that of the Embodiments 1 and 2 can be acquired except this.

Since assembly process 102C after this is the same as the Embodiments 1 and 2, explanation is omitted. In Embodiment 5, although the explanation is made using the flow of FIG. 1, the method explained by Embodiment 5 is applicable also to the flow of FIG. 36.

Embodiment 6

Figure 55:
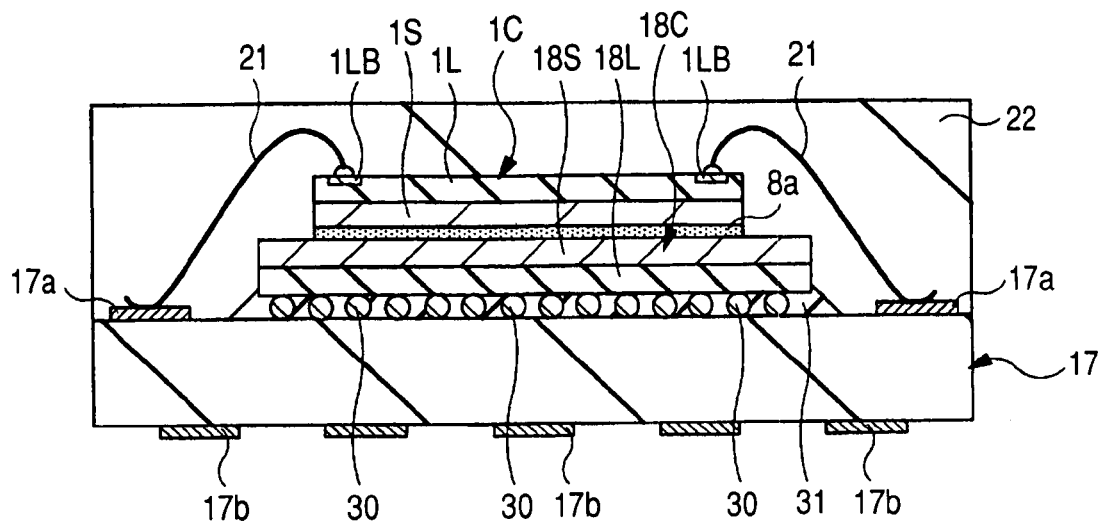
FIGS. 55 to 58 are cross-sectional views of the semiconductor device which is an other embodiment of the present invention.

FIG. 55 shows the cross-sectional view of the semiconductor device of Embodiment 6. In Embodiment 6, lower layer chip 18C is mounted on the main surface of wiring substrate 17 via bump electrode 30, where the main surface (device formation surface) is turned to the main surface of wiring substrate 17. It electrically connects with the electrode on the main surface of wiring substrate 17 through bump electrode 30, and the integrated circuit of chip 18C is electrically further connected to the wiring of wiring substrate 17. Bump electrode 30 includes, for example lead (Pb)-tin (Sn) solder. Under-filling 31 is filled up between the facing surfaces of chip 18C and wiring substrate 17.

Chip 1C is mounted on the back surface of chip 18C. The back surface of chip 1C is adhered on the back surface of chip 18C via adhesive layer 8a. The integrated circuit of the main surface of chip 1C is electrically connected to electrode 17a of wiring substrate 17 via wire 21 like the Embodiment 1. The thickness of the above-mentioned adhesive layer 8a is smaller than the distance between the facing surfaces of chip 18C and wiring substrate 17.

The mounting method of lower layer chip 18C is as follows, for example. First, chip 18C is transported to the chip mounting region of wiring substrate 17, after the main surface has turned to the bottom, and temporary fixing of bump electrode 30 of the main surface of chip 18C and the electrode of a main surface of wiring substrate 17 is made using paste material. Then, bump electrode 30 of chip 18C and the electrode of wiring substrate 17 are adhered (flip chip bonding) by making reflow treatment (heat treatment). Then, under-filling 31 is filled up between the facing surfaces of chip 18C and wiring substrate 17. Since the mounting method of the upper chip 1C is the same as the Embodiment 1, explanation is omitted. It is good also considering adhesive layer 8a as adhesive layers 8b and 8c explained by the Embodiment 2, and 4 and 5.

Embodiment 7

Figure 56:
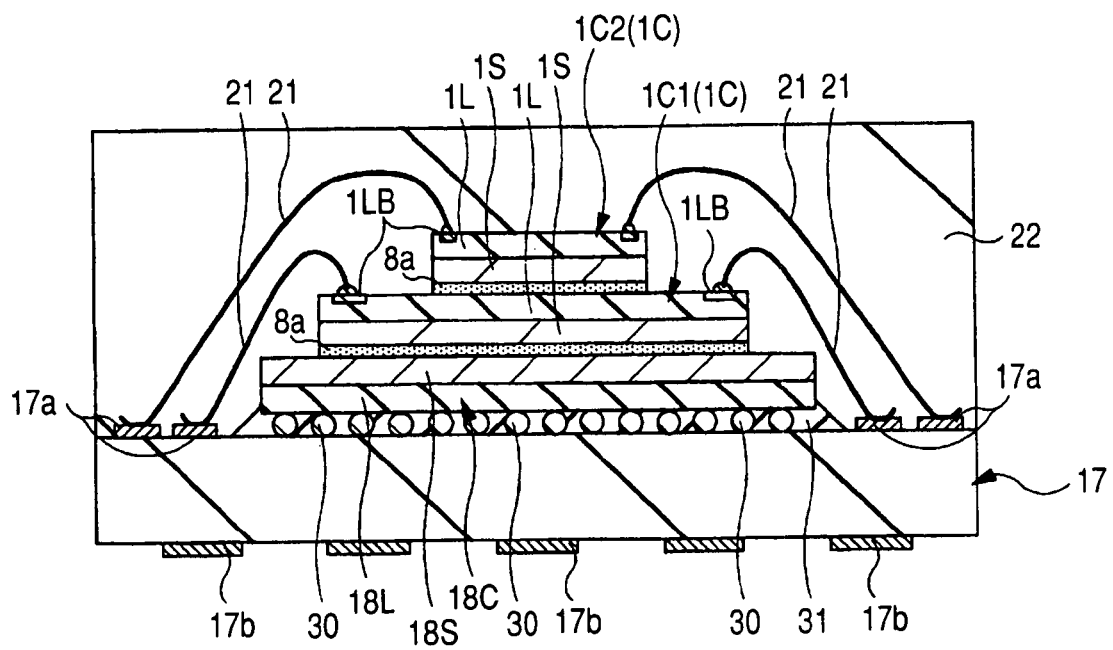

FIG. 56 shows the cross-sectional view of the semiconductor device of Embodiment 7. At Embodiment 7, on the main surface of chip 1C1 (1C), other chip 1C2 (1C) is mounted, where the main surface is turned upwards. The back surface of chip 1C2 of the top layer is adhered on the main surface of chip 1C1 via adhesive layer 8a. The integrated circuit of the main surface of chip 1C2 is electrically connected to electrode 17a of wiring substrate 17 via wire 21. Since adhesive layer 8a of the back surface of chip 1C1 and 1C2 is formed thinly, the semiconductor device which has the multi-stage structure of chip 18C, 1C1, and 1C2 can be made into a thin shape. The thickness of adhesive layer 8a of the back surface of chip 1C2 of the top layer is equal to the thickness of adhesive layer 8a of the back surface of an intermediate layer's chip 1C1. By making equal thickness of adhesive layer 8a of the back surface of respective chips 1C1 and 1C2, a thickness design of adhesive layer 8a of the back surface of respective chips 1C1 and 1C2 can be made easy.

Chip 18C of an undermost layer may be pasted up on the main surface of wiring substrate 17 by adhesive layer 20a like the Embodiment 1. In this case, the thickness of adhesive layer 20a is thicker than adhesive layer 8a of the back surface of chip 1C1 and 1C2. Adhesive layer 8a is replaceable to adhesive layer 8b or 8c explained by the Embodiment 2, and 4 and 5.

Embodiment 8

Figure 57:
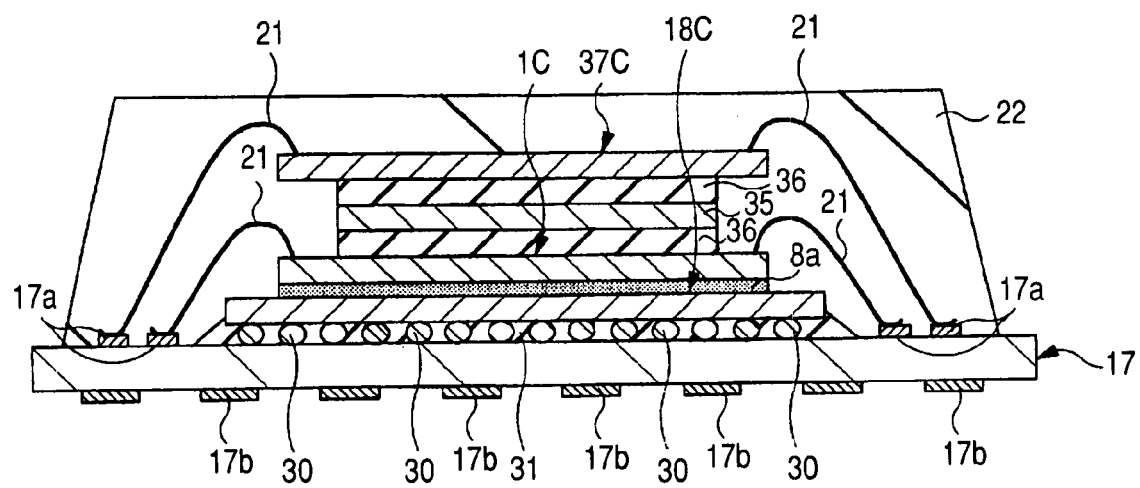

FIG. 57 shows the cross-sectional view of the semiconductor device of Embodiment 8. The semiconductor device of Embodiment 8 is set to SIP (System In Package) by which the system of the desired function was built in one package. On the main surface of wiring substrate 17, a plurality of thin chips 18C, 1C, and 37C are laminated. Chip 18C of the undermost layer is mounted on the main surface of wiring substrate 17 via bump electrode 30 of the main surface. Logic circuits, such as CPU (Central Processing Unit) and DSP (Digital Signal Processor), are formed in the main surface of this chip 18C, for example. On the back surface of this chip 18C, chip 1C is mounted via adhesive layer 8a. Memory circuits, such as SRAM (Static Random Access Memory) and a flash memory, are formed in the main surface of this chip 1C, for example. Pad 1LB of the main surface of this chip 1C is electrically connected with electrode 17a of the main surface of wiring substrate 17 via wire 21. On the main surface of this chip 1C, chip 37C is mounted via spacer 35 and DAF 36. Memory circuits, such as SRAM and a flash memory, are formed in this chip 37C, for example, and the pad of the main surface of chip 37C is electrically connected with electrode 17a of the main surface of wiring substrate 17 via wire 21. Such chips 18C, 1C, and 37C and wire 21 are sealed by sealing body 22.

Chip 18C may be pasted up on the main surface of wiring substrate 17 by adhesive layer 20a like the Embodiment 1. Adhesive layer 8a is replaceable to adhesive layer 8b or 8c explained by the Embodiment 2, and 4 and 5.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

Although mainly the case where invention made by the present inventor was applied to the manufacturing method of the semiconductor device which is the utilization field used as the background was explained in the above explanation, it is not limited to it, but many things can be applied, for example, it can be applied also to the manufacturing method of a micromachine.

The present invention is applicable to the manufacturing industry of a semiconductor device.

What is claimed is:

1. A manufacturing method of a semiconductor device, comprising the steps of:
    (a) preparing a wiring substrate which has a main surface and a back surface which become an opposite side mutually along a thickness direction;
    (b) mounting a first chip over the main surface of the wiring substrate; and
    (c) piling up a second chip over the first chip, and adheres the second chip over the first chip by an adhesive layer of solid state of the back surface;
    wherein a formation step of the second chip comprises the steps of:
        preparing a wafer which has a main surface and a back surface which become an opposite side mutually along a thickness direction;
        forming an element in the main surface of the wafer;
        forming a wiring layer over the main surface of the wafer;
        making the wafer thin;
        forming a reforming area used as a division origin of the wafer in a later wafer cutting step by irradiating a laser along a chip separating region of the wafer, putting together a condensing point with an inside of the wafer;
        applying a binding material of liquid state to the back surface of the wafer by a spin coating method, and forming the adhesive layer of the solid state over the back surface of the wafer; and
        cutting the wafer with the reforming area as a starting point, and obtaining the second chip which has the adhesive layer of the solid state over the back surface.

2. A manufacturing method of a semiconductor device according to claim 1, wherein
    the wiring layer has a low dielectric constant film.

3. A manufacturing method of a semiconductor device according to claim 1, wherein
    the mounting step of the first chip has a step which adheres the first chip over the wiring substrate by a film-like adhesion member.

4. A manufacturing method of a semiconductor device according to claim 1, wherein
    the mounting step of the first chip has a step which adheres the first chip over the wiring substrate with a paste state binding material, and a step which makes the paste state binding material into solid state drying the paste state binding material.

5. A manufacturing method of a semiconductor device according to claim 1, wherein
    a thickness of the adhesive layer of the solid state which pastes up the first chip and the second chip is thinner than a thickness of an adhesive layer which pastes up the first chip and the wiring substrate.

6. A manufacturing method of a semiconductor device according to claim 1, wherein
    a thickness of an adhesive layer between chips piled up over the main surface of the wiring substrate in many stages is mutually equal.

* * * * *